US011036149B2

(12) United States Patent
Matsuoka et al.

(10) Patent No.: US 11,036,149 B2
(45) Date of Patent: Jun. 15, 2021

(54) IMPRINT APPARATUS, METHOD OF OPERATING THE SAME, AND METHOD OF MANUFACTURING ARTICLE

(71) Applicant: CANON KABUSHIKI KAISHA, Tokyo (JP)

(72) Inventors: Yoichi Matsuoka, Shioya-gun (JP); Kiyohito Yamamoto, Utsunomiya (JP); Hisanobu Azuma, Utsunomiya (JP); Shigeru Terashima, Utsunomiya (JP); Toshihiro Maeda, Utsunomiya (JP); Masami Yonekawa, Utsunomiya (JP); Keiji Emoto, Saitama (JP); Kazuki Nakagawa, Utsunomiya (JP)

(73) Assignee: CANON KABUSHIKI KAISHA, Tokyo (JP)

( * ) Notice: Subject to any disclaimer, the term of this patent is extended or adjusted under 35 U.S.C. 154(b) by 445 days.

(21) Appl. No.: 16/105,341

(22) Filed: Aug. 20, 2018

(65) Prior Publication Data

US 2018/0356741 A1   Dec. 13, 2018

Related U.S. Application Data

(63) Continuation of application No. PCT/JP2017/005834, filed on Feb. 17, 2017.

(30) Foreign Application Priority Data

Feb. 26, 2016 (JP) .............. JP2016-036315
Nov. 18, 2016 (JP) .............. JP2016-225379
Feb. 3, 2017 (JP) .............. JP2017-018915

(51) Int. Cl.
*G03F 7/20* (2006.01)
*G03F 7/00* (2006.01)
*G06F 7/20* (2006.01)

(52) U.S. Cl.
CPC ........ *G03F 7/70925* (2013.01); *G03F 7/0002* (2013.01)

(58) Field of Classification Search
CPC ............ G03F 7/70002; G03F 7/70925; G03F 7/70341

(Continued)

(56) References Cited

U.S. PATENT DOCUMENTS 6,781,673 B2 * 8/2004 Moors ................ G03F 7/70558
355/53
8,226,392 B2 7/2012 Kawakami (Continued)

FOREIGN PATENT DOCUMENTS

JP   H09219432 A   8/1997
JP   2000252309 A   9/2000

(Continued)

OTHER PUBLICATIONS

International Search Report issued in Intl. Appln. No. PCT/JP2017/005834 dated Mar. 21, 2017. English translation provided.

(Continued)

*Primary Examiner* — Hung Nguyen
(74) *Attorney, Agent, or Firm* — Rossi, Kimms & McDowell LLP

(57) ABSTRACT

An imprint apparatus forms a pattern on a substrate by curing an imprint material on the substrate while the imprint material is in contact with a mold. The imprint apparatus includes a substrate chuck having a substrate holding region for holding the substrate, a peripheral member arranged to surround the side surface of the substrate held by the substrate chuck, and a control unit configured to control a cleaning process for cleaning at least a partial region of the peripheral member by using a cleaning member including a charging unit. The cleaning process includes an operation (Continued)

for attracting a particle in the partial region to the charging unit by moving the cleaning member relative to the peripheral member while the charging unit faces at least the partial region of the peripheral member.

33 Claims, 17 Drawing Sheets

(58) Field of Classification Search
USPC .......................................................... 355/30
See application file for complete search history.

(56) References Cited

U.S. PATENT DOCUMENTS

| | | | |
|---|---|---|---|
| 8,828,307 B2 | 9/2014 | Okushima et al. | |
| 9,694,535 B2 | 7/2017 | Mori | |
| 10,201,927 B2* | 2/2019 | Mizuno | B29C 59/002 |
| 2007/0272545 A1* | 11/2007 | Miyagi | H01L 21/02052 |
| | | | 204/198 |
| 2012/0228789 A1* | 9/2012 | Wakabayashi | B29C 59/02 |
| | | | 264/39 |
| 2013/0306101 A1 | 11/2013 | Swanson et al. | |
| 2015/0133032 A1* | 5/2015 | Kubo | B24B 47/16 |
| | | | 451/5 |
| 2015/0174816 A1 | 6/2015 | Mizuno et al. | |

FOREIGN PATENT DOCUMENTS

| | | |
|---|---|---|
| JP | 2002353086 A | 12/2002 |
| JP | 2007017895 A | 1/2007 |
| JP | 2007329493 A | 12/2007 |
| JP | 2008260273 A | 10/2008 |
| JP | 2009117440 A | 5/2009 |
| JP | 2009286085 A | 12/2009 |
| JP | 2012084654 A | 4/2012 |
| JP | 2013069732 A | 4/2013 |
| JP | 2014175340 A | 9/2014 |
| JP | 2014183069 A | 9/2014 |
| JP | 2015122373 A | 7/2015 |
| JP | 2015149390 A | 8/2015 |
| JP | 2016208006 A | 12/2016 |

OTHER PUBLICATIONS

Written Opinion issued in Intl. Appiln. No. PCT/JP2017/005834 dated Mar. 21, 2017.

* cited by examiner

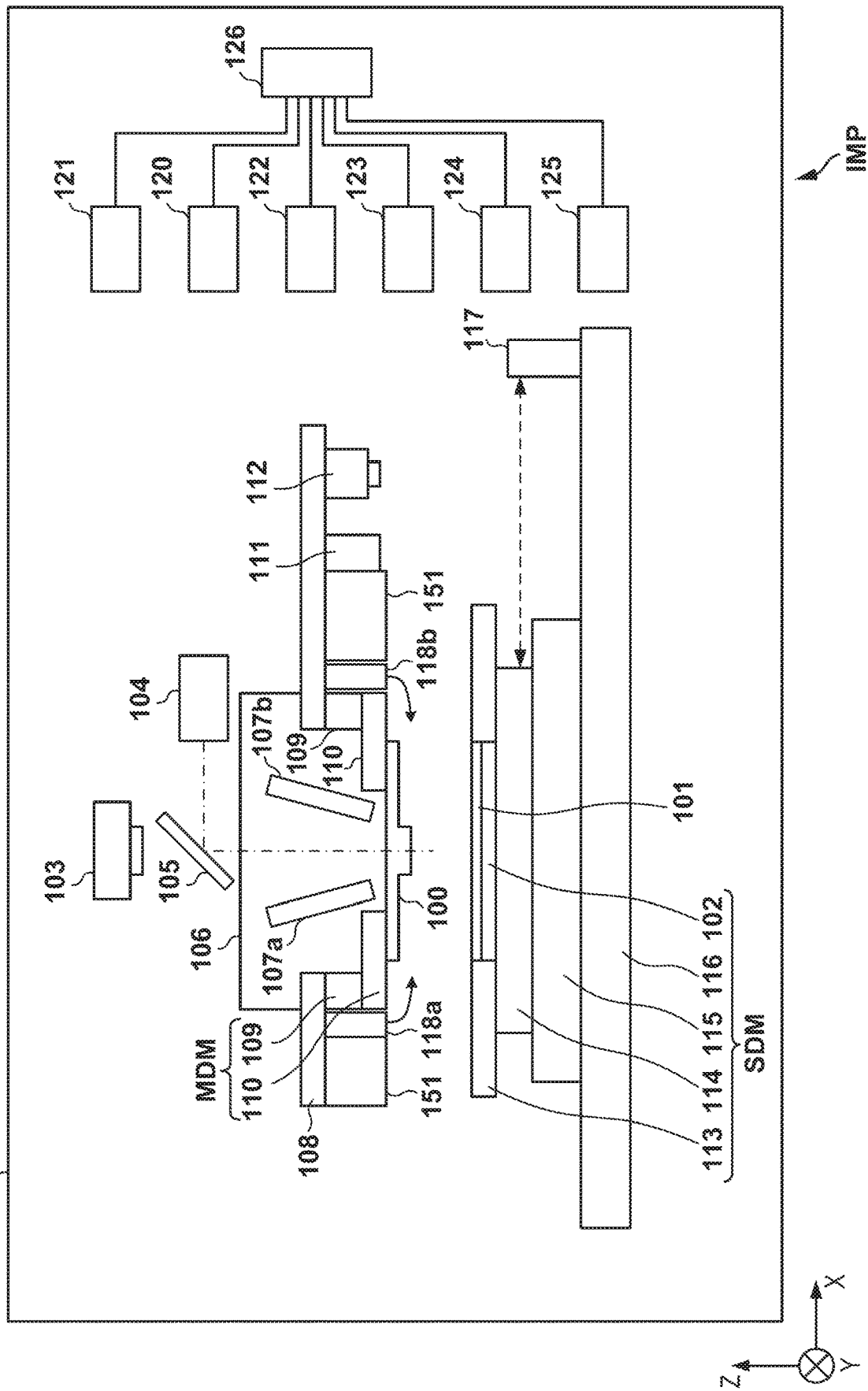

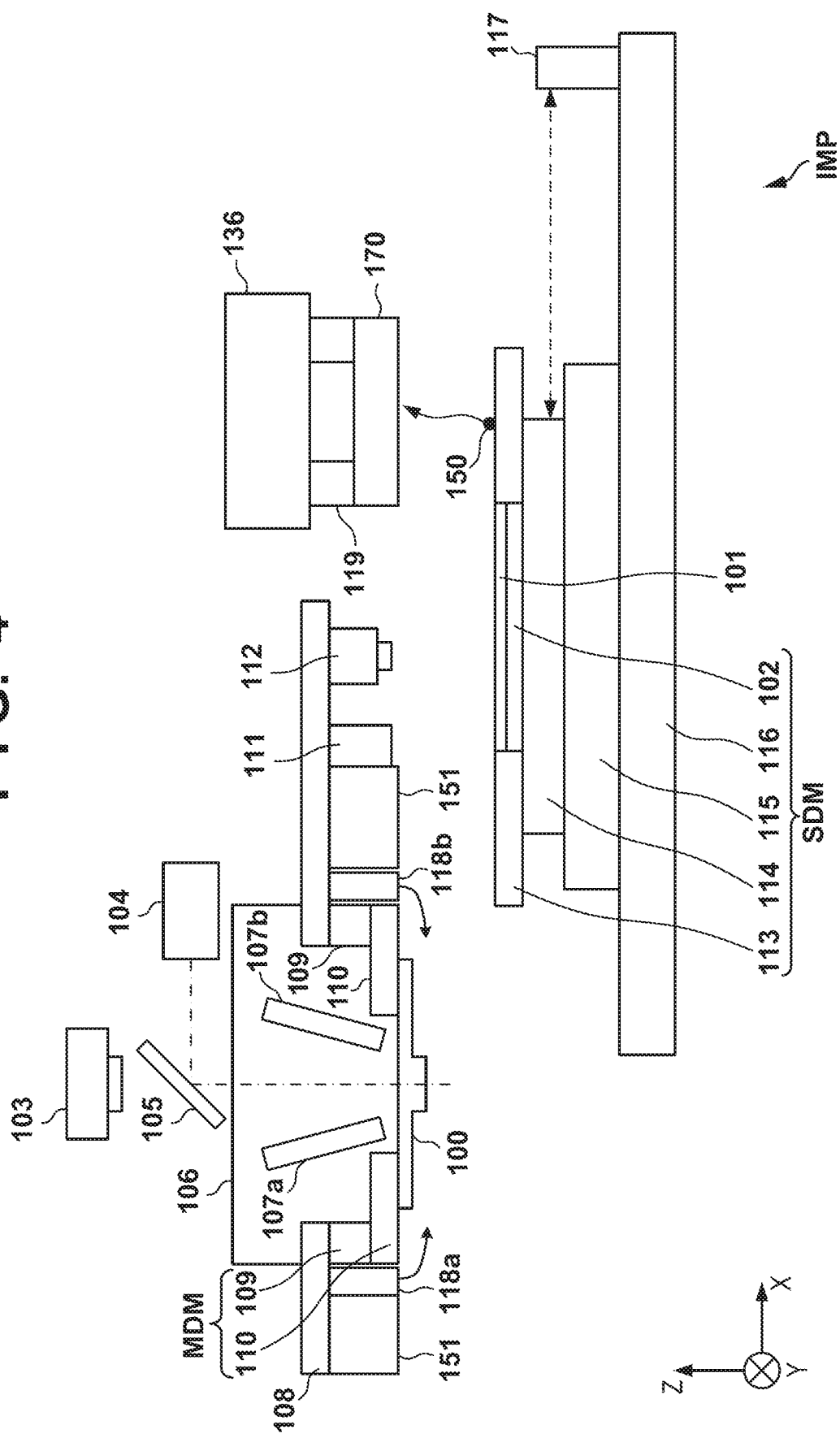

FIG. 8
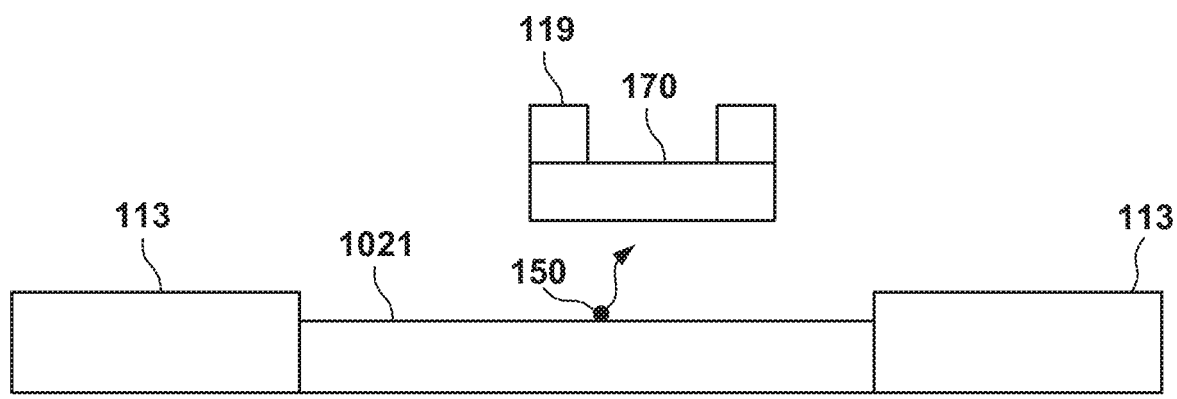
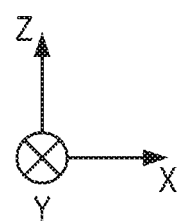

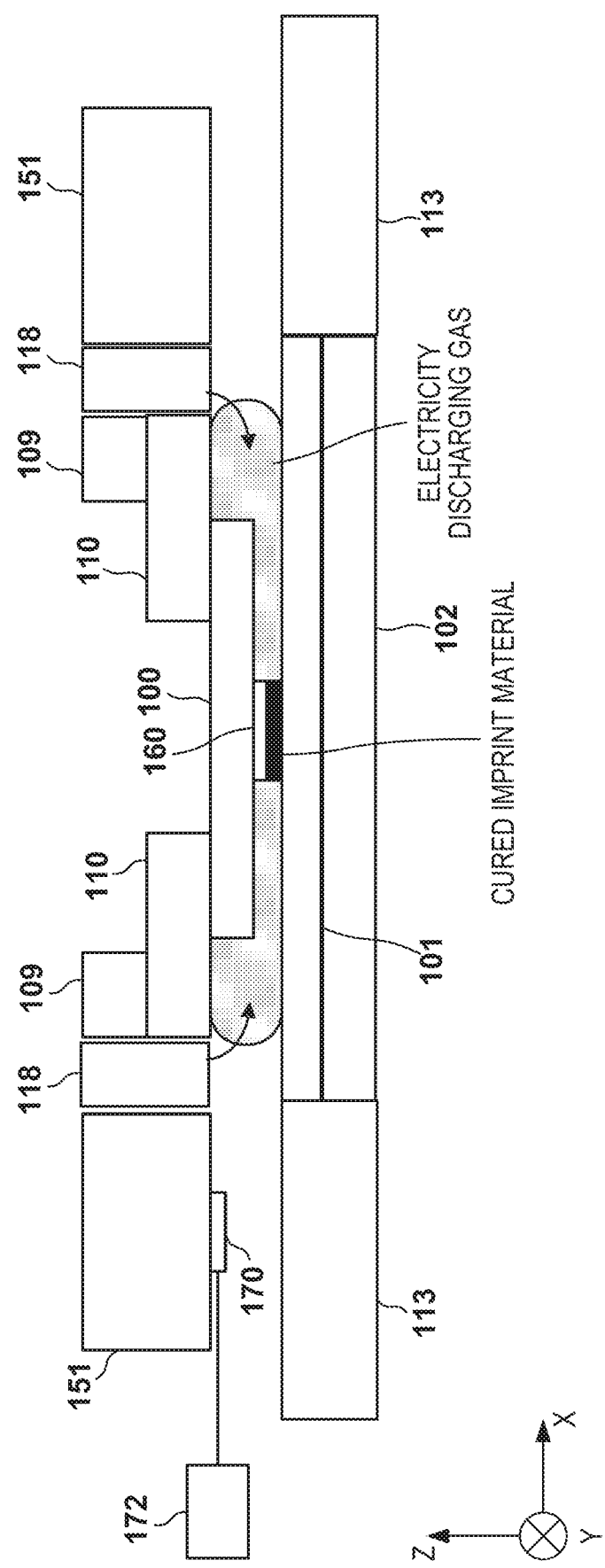

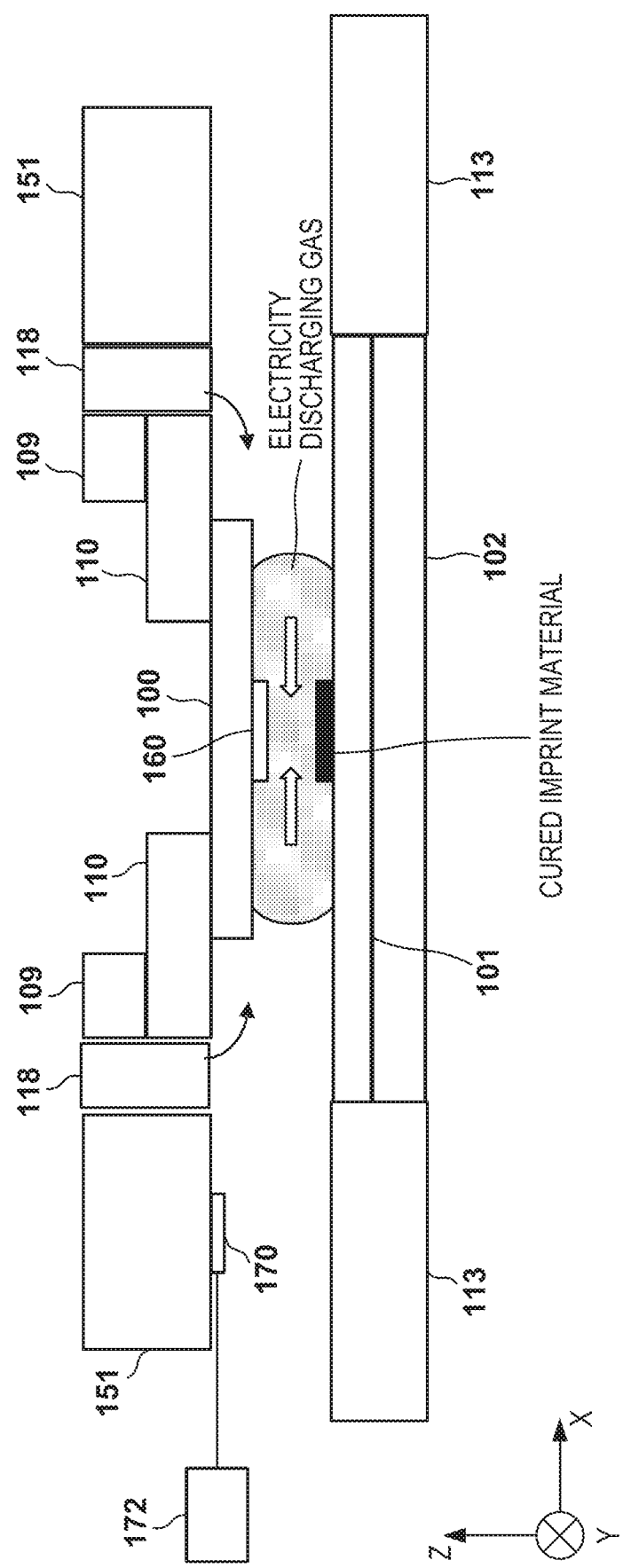

IMPRINT APPARATUS, METHOD OF OPERATING THE SAME, AND METHOD OF MANUFACTURING ARTICLE

CROSS-REFERENCE TO RELATED APPLICATIONS

This application is a Continuation of International Patent Application No. PCT/JP2017/005834, filed Feb. 17, 2017, which claims the benefit of Japanese Patent Application No. 2016-036315, filed Feb. 26, 2016, Japanese Patent Application No. 2016-225379, filed Nov. 18, 2016, and Japanese Patent Application No. 2017-018915, filed Feb. 3, 2017, which are hereby incorporated by reference herein in their entirety.

BACKGROUND OF THE INVENTION

Field of the Invention

The present invention relates to an imprint apparatus, a method of operating the same, and a method of manufacturing article.

Background Art

An imprint technique of curing an imprint material while a mold is brought into contact with the imprint material placed on a substrate to form a pattern on the substrate has received a great deal of attention. A pattern made of a concave portion is formed in the mold. When the mold is brought into contact with the imprint material on the substrate, the imprint material is filled in the concave portion by a capillary phenomenon. In order to promote filling of the imprint material in the concave portion and prevent curing of the imprint material by air (oxygen), a purge gas is supplied to a space between the substrate and the mold. When the imprint material is sufficiently filled in the concave portion, energy such as light or heat is applied to the imprint material. Accordingly, the imprint material is cured, and the pattern made of the concave portion formed in the mold is transferred to the imprint material on the substrate. After the imprint material is cured, the mold is released from the imprint material.

When the mold is released from the cured imprint material on the substrate, the mold can be charged. An electrostatic force (Coulomb force) is applied to particles by an electric field formed by this charging. This makes it possible to attract the particles to the mold and attach the particles to the mold. The particles may enter from the outside of the chamber of an imprint apparatus or may be produced by friction between mechanical members and friction between the mechanical members and the substrate or original in the chamber. Alternatively, when the imprint material is discharged from a discharge port to arrange an uncured imprint material on a substrate, an imprint material mist is produced. Particles can be then produced by solidifying the imprint material mist.

Japanese Patent Laid-Open No. 2014-175340 describes that a foreign material capturing region is formed in a mold and then charged to remove the foreign material existing in an atmosphere and/or on the substrate during conveyance of the substrate to a transfer position. Japanese Patent Laid-Open No. 2015-149390 describes that a pattern portion and a first conductive film are formed on the first surface of a mold, a second conductive film is formed on the second surface, and the first conductive film and the second conductive film are charged to attract particles near the pattern portion to the first conductive film.

When the mold is brought into contact with the imprint material on the substrate and the pattern is formed while the particles are attached to the mold, a pattern with a defect is formed, or the substrate and/or the mold can be damaged. On the other hand, an arrangement in which a peripheral member is arranged to surround the side surface of the substrate in order to efficiently supply the purge gas into the space between the substrate and the mold has been considered. By arrangement the peripheral member, the volume of the space under the mold can be reduced, and the purge gas can be efficiently maintained in the space.

However, when the peripheral member is arranged, the peripheral member faces the mold at a small distance when the substrate is to be moved after the mold is removed from the imprint material on the substrate. Since the electrostatic force is in inverse proportion to the square of the distance, the electrostatic force acting on the particles on the peripheral member can considerably be larger than the electrostatic force acting on the particles on the substrate holder in the absence of the peripheral member. The particles can be attached through processing of a large number of substrates. The particles of such particles, which are attached to the peripheral member with a weak attaching force are readily released from the peripheral member by the electrostatic force acting on them and can be attached to the mold.

SUMMARY OF THE INVENTION

The present invention provides a technique advantageous for reducing the pattern defects and damage to a substrate and/or a mold which can be generated by particles readily released from a peripheral member.

According to an aspect of the present invention, there is provided an imprint apparatus for forming a pattern on a substrate by curing an imprint material while a mold is brought into contact with the imprint material on the substrate, comprising a substrate chuck having a substrate holding region for holding the substrate, a peripheral member arranged to surround a side surface of the substrate held by the substrate chuck, and a control unit configured to control a cleaning process for cleaning at least a partial region of the peripheral member by using a cleaning member including a charging unit, wherein the cleaning process includes an operation for attracting a particle in the partial region to the charging unit by moving the cleaning member relative to the peripheral member while the charging unit faces at least the partial region of the peripheral member.

Further features of the present invention will become apparent from the following description of exemplary embodiments with reference to the attached drawings.

BRIEF DESCRIPTION OF THE DRAWINGS

FIG. 2 is a view schematically showing the arrangement of the imprint apparatus according to the embodiment of the present invention;

FIG. 4 is a view for explaining a holding unit for holding the cleaning member;

FIG. 8 is a view exemplifying the cleaning process of a substrate chuck;

FIG. 16A is a view showing discharge of a mold according to the third embodiment of the present invention; and FIG. 16B is a view showing discharge of the mold according to the third embodiment of the present invention.

DESCRIPTION OF THE EMBODIMENTS

Figure 1:
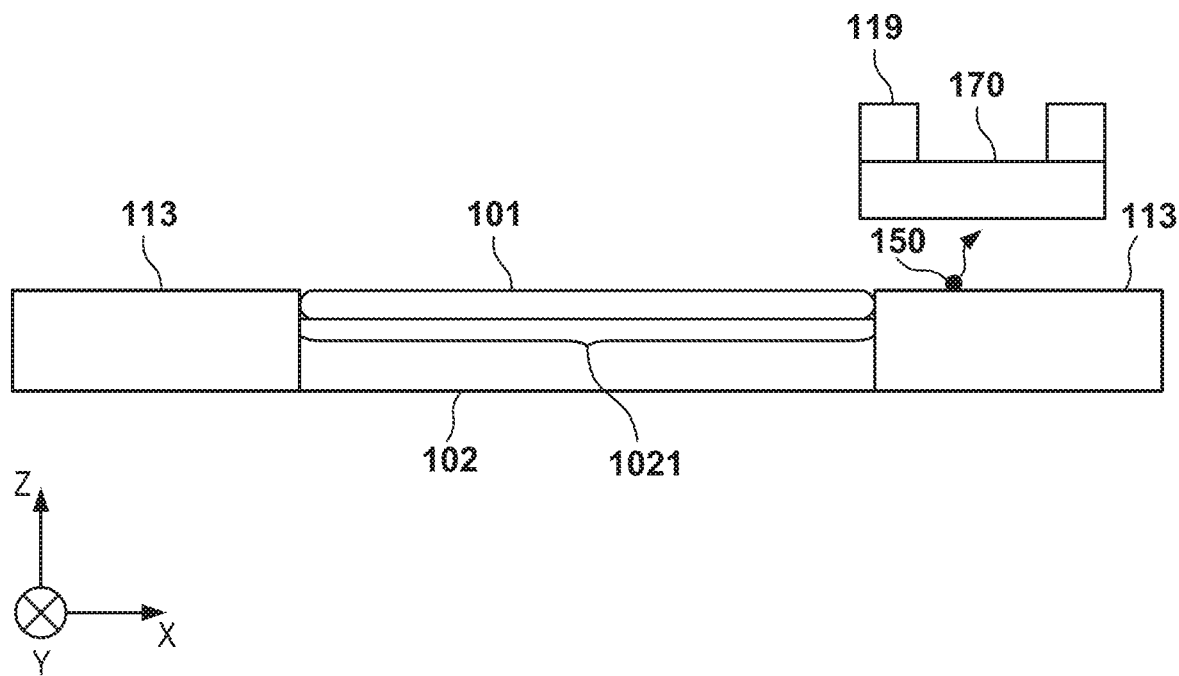
FIG. 1 is a view schematically showing the arrangement of part of an imprint apparatus according to an embodiment of the present invention.

An imprint apparatus and its operation method according to the present invention will be described using the exemplified embodiments with reference to the accompanying drawings.

FIG. 2 shows an example of the arrangement of an imprint apparatus IMP according to an embodiment of the present invention. The imprint apparatus IMP transfers the pattern of a mold 100 onto a substrate 101 by an imprint operation. In other words, the imprint apparatus IMP transfers the pattern of the mold 100 onto an imprint material (transfer target material) on the substrate 101 by the imprint operation. The imprint operation means that the mold is brought into contact with the imprint material and the imprint material is cured. The mold 100 has the pattern formed of a concave portion. When the mold 100 is brought into contact with the imprint material (uncured resin) on the substrate 101 to fill the concave portion of the pattern with the imprint material. In this state, energy for curing the imprint material is applied to the imprint material to cure the imprint material. Accordingly, the pattern of the mold 100 is transferred to the imprint material, so that the pattern made of the cured imprint material is formed on the substrate 101.

The imprint material is made of a curable composition which is cured when curing energy is applied to it. The imprint material can mean the material in a cured state or the material in an uncured state. Examples of the curing energy are an electromagnetic wave and heat. The electromagnetic wave can be light (for example, infrared light, visible light, or ultraviolet light) which can be selected within the wavelength range of 10 nm (inclusive) to 1 mm (inclusive).

The curable composition is typically a composition cured with light irradiation or heating. The photo-curable composition to be cured with light can contain at least a polymerizable compound and a photopolymerization initiator. In addition, the photo-curable composition can additionally contain a non-polymerizable compound or solvent. The non-polymerizable compound can be at least one material selected from the group consisting of a sensitizer, a hydrogen donor, an internal mold release agent, a surfactant, an antioxidant, and a polymer component.

In this specification and accompanying drawings, a direction is indicated as a direction in the XYZ coordinate system in which directions parallel to the surface of the substrate 101 are defined as the XY plane. Directions parallel to the X-, Y-, and Z-axes in the XYZ coordinate system are defined as X, Y, and Z directions, respectively. The rotations about the X-, Y-, and Z-axes are defined as $\theta X$, $\theta Y$, and $\theta Z$, respectively. The control and driving operations in the X-, Y-, and Z-axes indicate the control and driving operations in the directions parallel to the X-, Y-, and Z-axes, respectively. The control and driving operations about the $\theta X$-, $\theta Y$-, and $\theta Z$-axes indicate the control and driving operations for the rotations about axes parallel to the X-, Y-, and Z-axes. A position is information specified based on coordinates of the X-, Y-, and Z-axes. An orientation is information specified by relative rotations about the $\theta X$-, $\theta Y$-, and $\theta Z$-axes. Alignment indicates control of a position and/or orientation.

The imprint apparatus IMP includes a substrate driving mechanism SDM for aligning the substrate 101. The substrate driving mechanism SDM includes, for example, a substrate chuck 102, a peripheral member 113, a fine moving mechanism 114, a coarse moving mechanism 115, and a base structure 116. The substrate chuck 102 has a substrate holding region for holding the substrate 101, and can hold the substrate 101 by suction (for example, vacuum suction or electrostatic suction). The fine moving mechanism 114 can include a fine moving stage for supporting the substrate chuck 102 and the peripheral member 113 and a driving mechanism for driving the fine moving stage. The peripheral member 113 is arranged around the region where the substrate 101 is arranged so as to surround the side surface of the substrate 101. The peripheral member 113 can have an upper surface having the same height as that of the upper surface of the substrate 101. The peripheral member 113 may be divided into a plurality of members. In addition, all or some of the plurality of members may be arranged to be spaced apart from each other or in contact with each other.

The fine moving mechanism 114 is a mechanism for finely driving the substrate 101 by finely driving the substrate chuck 102. The coarse driving mechanism 115 is a mechanism for coarsely driving the substrate 101 by coarsely driving the fine moving mechanism 114. The base structure 116 supports the coarse driving mechanism 115, the fine moving mechanism 114, the substrate chuck 102, and the peripheral member 113. The substrate driving mechanism SDM can be configured to, for example, drive the substrate 101 with respect to a plurality of axes (for example, three axes including the X-, Y-, and $\theta Z$-axes). A measuring unit 117 such as an interferometer monitors the position of a portion (fine moving stage) of the fine moving mechanism 114 which is integrated with the substrate chuck 102.

The imprint apparatus IMP includes a mold driving mechanism MDM for aligning the mold 100. The mold driving mechanism MDM can include a mold chuck 110, a driving mechanism 109, and a peripheral member 151. The peripheral member 151 is arranged around a region where the mold 100 is arranged so as to surround the side surface of the mold 100. A support structure 108 can support the mold driving mechanism MDM and the peripheral member 151. The mold chuck 110 can hold the mold 100 by suction (for example, vacuum suction or electrostatic suction). The driving mechanism 109 drives the mold 100 by driving the mold chuck 110. For example, the mold driving mechanism MDM can be configured to drive the mold 100 with respect to a plurality of axes (for example, six axes including the X-, Y-, Z-, θX-, θY-, and θZ-axes).

The substrate driving mechanism SDM and the mold driving mechanism MDM constitute a driving unit for relatively aligning the substrate 101 and the mold 100. The driving unit adjusts the relative position between the substrate 101 and the mold 100 with respect to the X-, Y-, θX-, θY-, and θZ-axes, and also adjusts the relative position between the substrate 101 and the mold 100 with respect to the Z-axis. The alignment of the relative position between the substrate 101 and the mold 100 with respect to the Z-axis includes operations for bringing an imprint material and the mold 100 into contact with each other on the substrate 101 and separating them from each other.

The imprint apparatus IMP can include a dispenser (supply unit) 111 that applies, arranges, or supplies an uncured imprint material onto the substrate 101. The dispenser 111 can be configured to arrange an imprint material on the substrate 101, for example, in the form of a plurality of droplets. The support structure 108 can support the dispenser 111.

The imprint apparatus IMP can include a curing unit 104 that cures the imprint material on the substrate 101 by irradiating the imprint material with light such as UV light. The imprint apparatus IMP can also include a camera 103 for the observation of the state of imprinting. Light emitted from the curing unit 104 can be reflected by a mirror 105 and transmitted through the mold 100 to irradiate the imprint material. The camera 103 can be configured to observe the state of imprinting, for example, the contact state between the imprint material and the mold 100 through the mold 100 and the mirror 105.

The imprint apparatus IMP can include alignment scopes 107a and 107b for detecting the relative position between a mark on the substrate 101 and a mark on the mold 100. The alignment scopes 107a and 107b can be arranged in an upper structure 106 supported by the support structure 108. The imprint apparatus IMP can include an off-axis scope 112 for detecting the positions of a plurality of marks on the substrate 101. The support structure 108 can support the off-axis scope 112.

The imprint apparatus IMP can include one or a plurality of purge gas supply units 118a and 118b. The purge gas supply units 118a and 118b can be arranged around the mold chuck 110 so as to surround the mold chuck 110. The purge gas supply units 118a and 118b supply a purge gas to the space between the substrate 101 and the mold 100. For example, the support structure 108 can support the purge gas supply units 118a and 118b. As a purge gas, it is possible to use a gas that does not interfere with the curing of an imprint material, for example, a gas containing at least one of helium gas, nitrogen gas, and a condensable gas (for example, pentafluoropropane (PFP)). The arrangement provided with the peripheral members 113 and 151 is advantageous for efficiently filling the space between the substrate 101 and the mold 100 with a purge gas.

The imprint apparatus IMP includes a chamber 190. The constituent elements described above can be arranged in the chamber 190. The imprint apparatus IMP can further include a main control unit (control unit) 126, an imprint control unit 120, an irradiation control unit 121, a scope control unit 122, a dispenser control unit 123, a purge gas control unit 124, and a substrate control unit 125. The main control unit 126 controls the imprint control unit 120, the irradiation control unit 121, the scope control unit 122, the dispenser control unit 123, the purge gas control unit 124, and the substrate control unit 125. The imprint control unit 120 controls the mold driving mechanism MDM. The irradiation control unit 121 controls the curing unit 104. The scope control unit 122 controls the alignment scopes 107a and 107b and the off-axis scope 112. The dispenser control unit 123 controls the dispenser 111. The purge gas control unit 124 controls the purge gas supply units 118a and 118b. The substrate control unit 125 controls the substrate driving mechanism SDM.

FIG. 1 schematically shows part of the imprint apparatus IMP in FIG. 2. Particles 150 can enter the internal space of the chamber 190. The particles 150 can be produced by, for example, friction between mechanical members and friction between the mechanical members and the substrate or original in the chamber 190. Alternatively, when the dispenser 111 discharges the imprint material from a discharge port to arrange an uncured imprint material on the substrate 101, an imprint material mist is produced. The particles 150 can then be produced when the imprint material mist solidifies.

The particles 150 can be attached to the upper surface of the peripheral member 113 and the like. The particles 150 are attached to the peripheral member 113 with various strengths. When the particles 150 attached to the peripheral member 113 are not released from the peripheral member 113, no pattern defects or damage to a substrate and/or a mold occurs, which occurs when the particles 150 are attached to the substrate 101 or the mold 100. In contrast, when the particles 150 attached to the peripheral member 113 are released from the peripheral member 113, the particles 150 are attached to the substrate 101 or the mold 100 or held between the substrate 101 and the mold 100.

When the mold 100 is released from the cured imprint material on the substrate 101, the mold 100 can be charged. An electrostatic force (Coulomb force) is applied to the particles 150 by an electric field formed by this charging. This can cause the particles 150 to be attracted to the mold 100 and attached to the mold 100. Because the upper surface of the peripheral member 113 can have the same height as that of the upper surface of the substrate 101, the distance between the mold 100 and the peripheral member 113 is very small. Since the electrostatic force is in inverse proportion to the square of the distance, the electrostatic force acting on the particles on the peripheral member 113 can considerably be larger than the electrostatic force acting on the particles on the substrate chuck 102 and a member present around it in the absence of the peripheral member 113. The many particles 150 can be attached to the peripheral member 113 through processing of a large number of substrates 101.

Under the circumstance, the imprint apparatus IMP executes a cleaning process for cleaning at least a partial region of the peripheral member 113 by using a cleaning member 170 including a charging unit. The main control unit (control unit) 126 can perform a cleaning process by controlling the driving operation of the cleaning member 170 including the charging unit. The cleaning process can include an operation for attracting the particles 150 in the region to the charging unit by moving the cleaning member 170 relative to the region while the charging unit of the cleaning member 170 faces at least the partial region of the peripheral member 113. In this case, the particles 150 attached to the peripheral member 113 with a weak attaching force can be released from the peripheral member 113 and attached to the charging unit by an electrostatic force when the cleaning member 170 including the charging unit faces the peripheral member 113. Typically, a cleaning process is executed in the absence of any imprint material on the substrate 101, and the dispenser 111 supplies no imprint material onto the substrate 101 during the cleaning process.

FIG. 1 shows how a cleaning process is executed while the substrate 101 is present on a substrate holding region 1021 of the substrate chuck 102. However, a cleaning process may be performed in the absence of the substrate 101 on the substrate holding region 1021. The substrate holding region 1021 may be a region that entirely comes into contact with the substrate 101 or partially comes into contact with the substrate 101. In the latter case, a portion of the region which comes into contact with the substrate 101 can have a pin and/or a ring.

Consider a case in which when the mold 100 is released from the cured imprint material on the substrate 101, the mold 100 is charged to −3 kV. Assume that the peripheral member 113 is grounded to the ground potential. Assume that the gap between the peripheral member 113 and the mold 100 is 1 mm. The direction of an electric field in this case is upward (the positive direction along the Z-axis), and the strength of the electric field is 3 kV/mm. In this case, the charging unit of the cleaning member 170 is preferably charged to a potential V (V<−3 kV) lower than −3 kV. In a cleaning process, while the charging unit of the cleaning member 170 is charged and faces at least a partial region of the peripheral member 113, the cleaning member 170 is moved relative to the region. With this cleaning process, the particles 150 attached to the partial region with a weak attaching force are released from the region and attracted to and captured by the charging unit.

Reducing the gap between the peripheral member 113 and the charging unit of the cleaning member 170 in a cleaning process can increase the electric field between the peripheral member 113 and the charging unit. This can enhance the effect of the cleaning process. For example, letting GN be the gap between the mold 100 and the peripheral member 113 when the substrate 101 is moved to supply an imprint material from the dispenser 111 onto the substrate 101 and GC be the gap between the peripheral member 113 and the charging unit in a cleaning process, GN>GC can be set. The gap between the peripheral member 113 and the charging unit of the cleaning member 170 in a cleaning process can be set to, for example, 0.8 mm or less.

A holding unit 119 can hold the cleaning member 170. The holding unit 119 can be any unit that has a structure capable of holding the cleaning member 170. For example, this unit may be a movable member such as a robot arm or a fixed member. Alternatively, the mold chuck 110 may be used as a substitution for the unit.

Figure 3A:
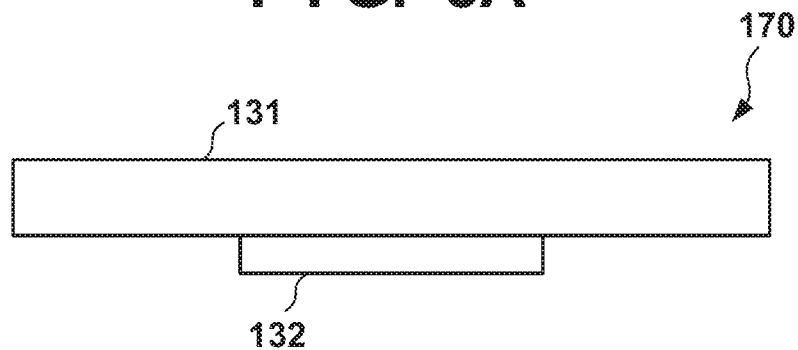
FIG. 3A is a view exemplifying a cleaning member.
Figure 3B:
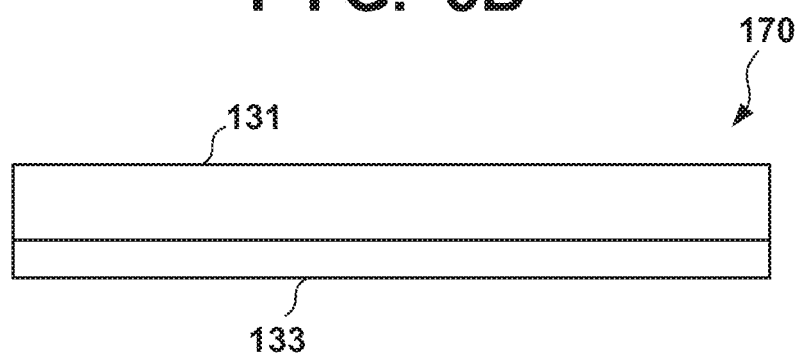
FIG. 3B is a view exemplifying a cleaning member.
Figure 3C:
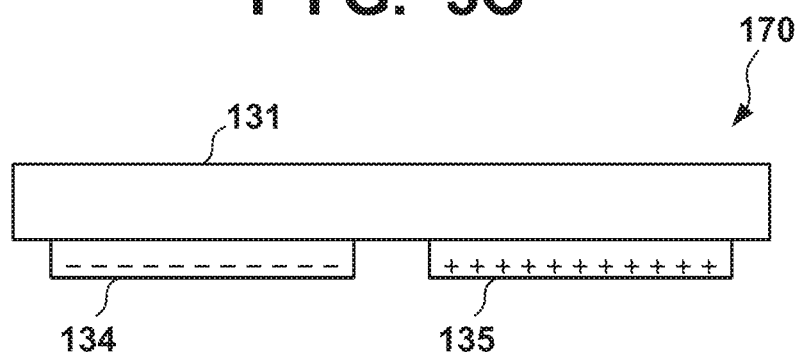
FIG. 3C is a view exemplifying a cleaning member.

FIGS. 3A to 3C each show an example of the cleaning member 170. In the first example shown in FIG. 3A, the cleaning member 170 includes a support 131 and a charging unit 132 held by the support 131. The charging unit 132 can be prepared by charging a dielectric member made of quartz or the like. The dielectric member can be charged by being brought into contact with the imprint material arranged on a dummy substrate and being released from the imprint material cured by the curing unit 104. The dummy substrate is a substrate that can be placed on the substrate chuck 102 in place of the substrate 101. The support 131 and the charging unit 132 can be made of the same material.

The larger the surface area that comes into contact with an imprint material, the larger the charge amount. Accordingly, the charging unit 132 may have a pattern (concave/convex pattern) on its surface. The cleaning member 170 including the support 131 and the charging unit 132 may be, for example, the mold 100 as a disused article (for example, a used or non-standard mold). Alternatively, the cleaning member 170 including the support 131 and the charging unit 132 may be a member that has a higher pattern density than the mold 100 for the manufacture of an article and is advantageous for increasing the charge amount (for example, a mold as a disused article that is used for the inspection of the imprint apparatus IMP). Note that a disused article is an article that is not used for its original purpose.

In the second example shown in FIG. 3B, the cleaning member 170 includes a support 131 and an electret 133 supported by the support 131. An electret is a material that keeps forming an electric field, which can be formed by implanting and fixing charge in a dielectric substance such as a polymeric material. Examples of methods of implanting charge into an electret include a method of solidifying a polymeric material in a molten state while applying a high voltage between electrodes sandwiching the polymeric material, a method using corona discharge, and a method using ion implantation. In the method of applying a voltage between the electrodes, the surfaces of the electret which are in contact with the respective electrodes are charged to positive and negative polarities. In the method using corona discharge, the electret is charged to negative polarity. In the method using ion implantation, the electret is generally charged to positive polarity.

In the first example, because excess charge is distributed over the surface of the dielectric member of the charging unit 132, the charge amount decreases depending on the environments. In contrast to this, the electret used in the second example can semi-permanently hold charge because charge is implanted into the dielectric material. In the example shown in FIG. 3B, although the electret 133 is provided on the entire lower surface of the support 131, the electret 133 may be provided on only part of the lower surface. In addition, as described in the first example, an electret may be arranged on the lower surface of a mold as a disused article.

Examples of materials for electrets can be (a) polymeric materials such as acrylic resins, nylons, and fluorine resins and (b) inorganic films such as an $SiO_2$ film and an $SiO_2$/$Si_xN_y$ multilayer film. Fluorine resins include, as organic electret films that can be formed by spin coating, Teflon AF® (available from Du Pont) and CYTOP® (available from Asahi Glass). CYTOP, in particular, is featured to have a high surface charge density.

It is also possible to use, as a charging unit, a unit configured to have electrodes covered with a dielectric material. Assume that a charging unit is formed from exposed electrodes, and particles are metal particles. In this case, the particles attached to the charging unit are charged to the same polarity as that of the electrodes by charge exchange. As a consequence, the particles are released from the charging unit by a repulsive force, and hence cannot be captured by the charging unit. For this reason, covering the electrodes with a dielectric material allows the charging unit to capture even metal particles by preventing charge exchange.

In the third example shown in FIG. 3C, the cleaning member 170 includes a support 131 and a negative charging unit 134 and a positive charging unit 135 which are supported by the support 131. As the negative charging unit 134 and the positive charging unit 135, electrets described in the second example can be used. Providing the negative charging unit 134 charged to negative polarity and the positive charging unit 135 charged to positive polarity can remove particles attached to the peripheral member 113 regardless of the polarity of the particles.

The holding unit 119 that holds the cleaning member 170 will be supplementarily described with reference to FIG. 4. As described above, the holding unit 119 is only required to be able to hold the cleaning member 170. For example, the holding unit 119 may be a movable member such as a robot arm or a fixed member. Alternatively, the mold chuck 110 may be used as a substitution for the unit.

For example, the holding unit 119 can be a constituent element of a maintenance unit 136. The maintenance unit 136 can be, for example, a unit for the attachment/detachment of the substrate chuck 102. The substrate chuck 102 can be contaminated or worn by contact with the substrate 101, and hence can be replaced by using the maintenance unit 136. The maintenance unit 136 has a holding mechanism for holding the substrate chuck 102. This holding mechanism can be used as the holding unit 119. The substrate chuck 102 is not replaced concurrently with a cleaning process for the peripheral member 113. Accordingly, no specific disadvantage is expected when a cleaning process is performed while the maintenance unit 136 holds the cleaning member 170. In addition, performing a cleaning process while the maintenance unit 136 holds the cleaning member 170 will contribute to the simplification of the arrangement of the imprint apparatus IMP.

When a cleaning process is to be performed while the mold chuck 110 holds the cleaning member 170, it is possible to transfer the cleaning member 170 to the mold chuck 110 by using a transfer mechanism for transferring the mold 100 to the mold chuck 110.

Figure 5:
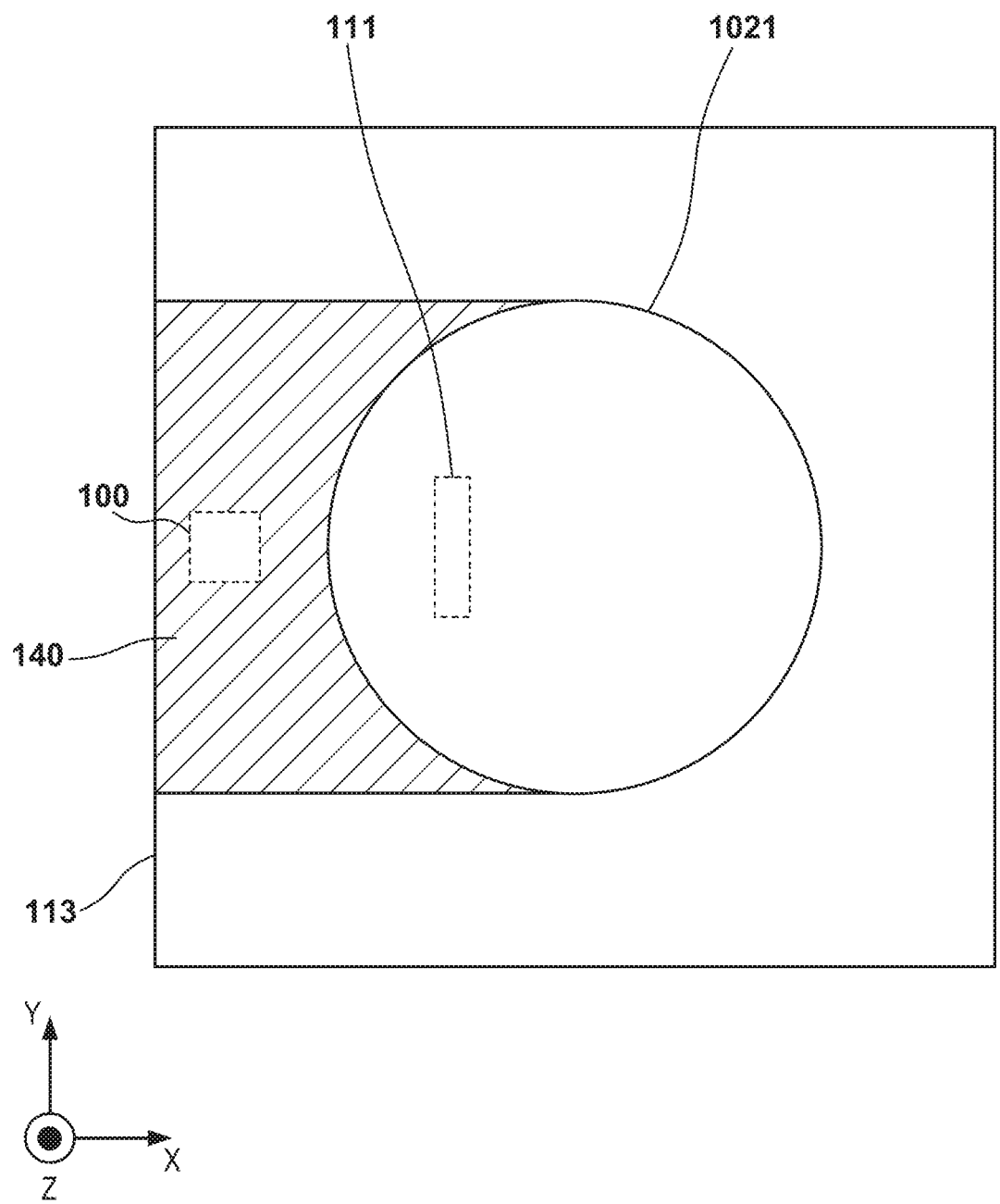
FIG. 5 is a view exemplifying a peripheral member.

FIG. 5 is a top view of the peripheral member 113, exemplifying the shape of the peripheral member 113. In the case shown in FIG. 5, the peripheral member 113 has, for example, a rectangular outer shape, and can have various outer shapes. The peripheral member 113 has an opening portion surrounding the side surface of the substrate 101. The shape of the opening portion conforms to the outer shape of the substrate 101.

The peripheral member 113 can include a continuous portion having a smooth surface and discontinuous portions each having a rough surface. A reference mark for measuring the relative position between the mold 100 and a reference of the imprint apparatus IMP is arranged on the peripheral member 113. In addition, when light is used as energy for curing, an illuminance meter for measuring the illuminance of light can be arranged on the peripheral member 113. Grooves or stepped portions can exist between members or units typified by the reference mark and the illuminance meter and the peripheral member 113. In addition, when the peripheral member 113 is constituted by a plurality of divided components, grooves or stepped portions can exist between the components. Furthermore, a fastening portion for fastening the peripheral member 113 to the fine moving mechanism 114 can form grooves or stepped portions. Such grooves or stepped portions constitute examples of the discontinuous portions each having the rough surface. On the other hand, a smooth upper surface is an example of the continuous portion having the smooth surface. The main control unit 126 can control a cleaning process such that the total time during which the charging unit of the cleaning member 170 faces the discontinuous portions per unit area becomes longer than the total time during which the charging unit of the cleaning member 170 faces the continuous portion per unit area.

In the imprint apparatus IMP, in order to form patterns in a plurality of shot regions on the substrate 101 by using an imprint material, an imprint sequence (pattern forming method) constituted by a plurality of imprint cycles can be executed. Each imprint cycle can include a step of arranging an imprint material on the substrate 101 by using the dispenser 111, a step of bringing the mold 100 into contact with the imprint material, a step of curing the imprint material, and a step of releasing the mold 100 from the cured imprint material.

FIG. 5 exemplifies the positional relationship between the peripheral member 113, the mold 100, and the dispenser 111 when the dispenser 111 arranges an imprint material in a given region on the substrate 101. A pattern region (a region having a pattern to be transferred onto the substrate 101) of the mold 100 is arranged on the peripheral member 113.

A region 140 is a region that can face a pattern region of the mold 100 in a period during which an imprint sequence is executed, that is, a period during which patterns are respectively formed in a plurality of shot regions of a substrate. The region 140 is a region, of the entire upper surface of the peripheral member 113, which tends to become a particle source for the pattern region of the mold 100 in an imprint sequence. Accordingly, when a target for a cleaning process is to be limited to a partial region instead of the entire upper surface of the peripheral member 113, the cleaning process should be executed for a region including at least the region 140.

For example, the mold driving mechanism MDM for driving the mold 100 is located at the first azimuth position (in the minus direction of the X-axis) when viewed from the dispenser 111. The region 140 is a region, of the upper surface of the peripheral member 113, which is located closer to the first azimuth position than the side surface of the substrate 101, held by the substrate chuck 102, which is located on the first azimuth side.

FIGS. 6A to 6D each exemplify a cleaning process in which, while the charging unit of the cleaning member 170 faces at least a partial region of the peripheral member 113, the cleaning member 170 is moved relative to the partial region. In the example shown in FIG. 6A, the main control unit 126 controls a cleaning process so as to selectively clean the region 140 of the peripheral member 113. Such a cleaning process is advantageous for shortening the time required for the process. In the example shown in FIG. 6B, the main control unit 126 controls a cleaning process so as to clean the entire region of the peripheral member 113. The movement of the charging unit of the cleaning member 170 relative to the peripheral member 113 in a cleaning process can be a continuous repetition of a predetermined unit of operation, as exemplified by FIGS. 6A and 6B. This unit of operation can include relative movement in a direction parallel to the first direction (for example, the X-axis direction) and relative movement in the second direction (for example, the Y-axis direction) intersecting with the first direction.

Figure 6A:
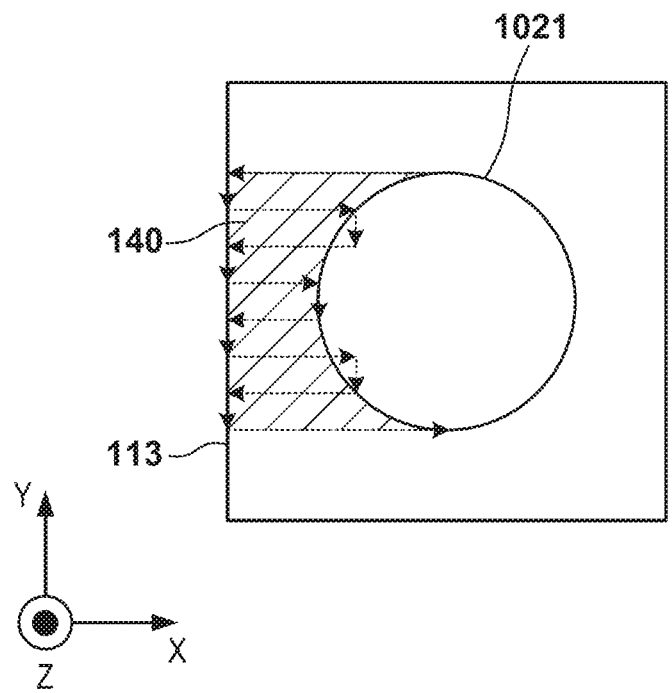
FIG. 6A is a view exemplifying the cleaning process of the peripheral member.
Figure 6B:
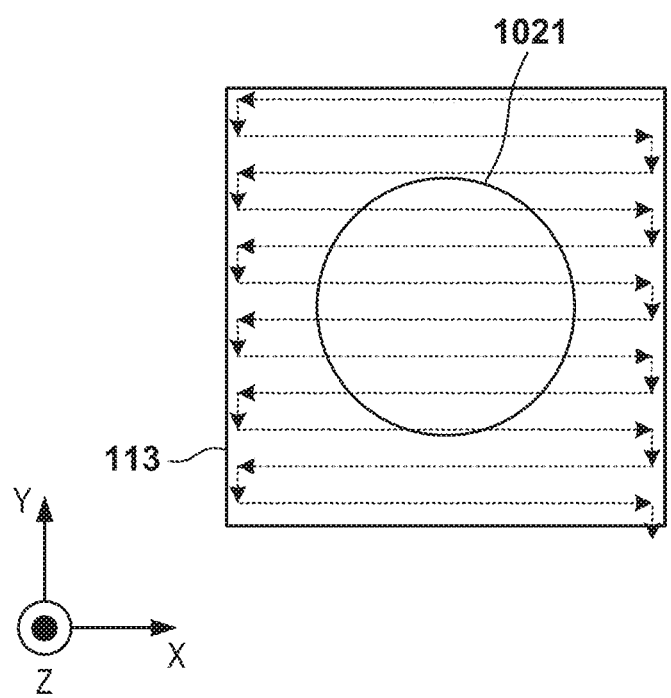
FIG. 6B is a view exemplifying the cleaning process of the peripheral member.
Figure 6C:
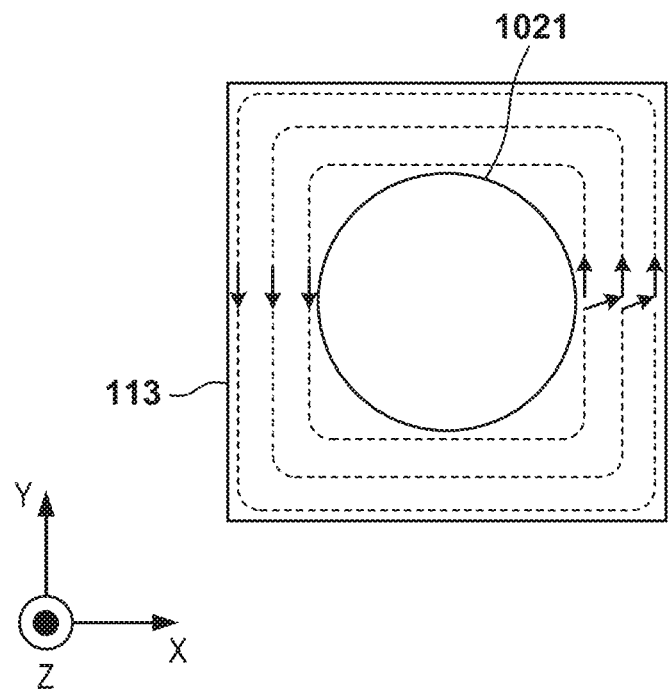
FIG. 6C is a view exemplifying the cleaning process of the peripheral member.

In the example shown in FIG. 6C, the path of the movement of the charging unit of the cleaning member 170 relative to the peripheral member 113 can include a plurality of loops surrounding the substrate holding region 1021. In this case, the plurality of loops have different distances from the substrate holding region 1021. In the example shown in FIG. 6C, the path does not pass through the substrate holding region 1021. However, the path may pass through the substrate holding region 1021.

Figure 6D:
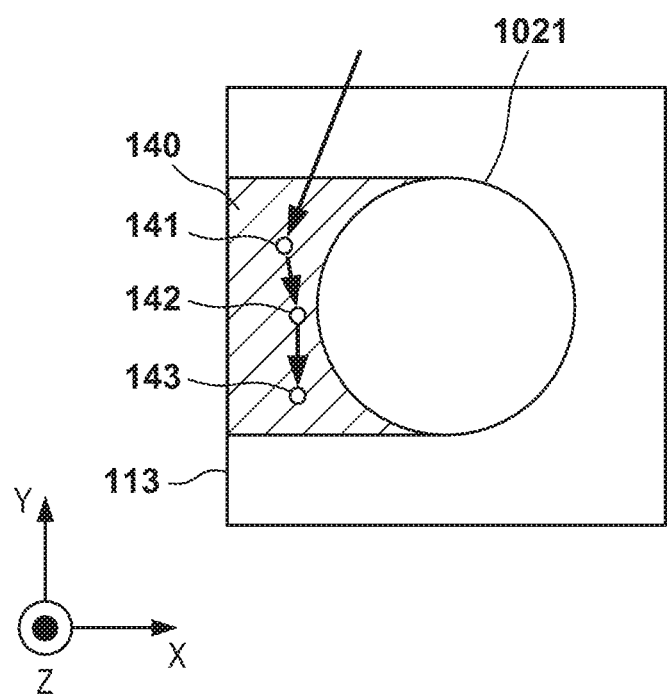
FIG. 6D is a view exemplifying the cleaning process of the peripheral member.

In the example shown in FIG. 6D, the peripheral member 113 has discontinuous portions 141, 142, and 143 such as grooves and/or stepped portions and the remaining portion as a continuous portion. Because the discontinuous portions 141, 142, and 143 more easily capture particles than the continuous portion, more particles can exist on the discontinuous portions 141, 142, and 143 than on the continuous portion. The main control unit 126 can control a cleaning process such that the total time during which the charging unit of the cleaning member 170 faces the discontinuous portion 141, 142, and 143 per unit area becomes longer than the total time during which the charging unit of the cleaning member 170 faces the continuous portion per unit area.

For example, upon receiving a command to execute an imprint process for forming a pattern on a substrate by imprinting, the main control unit 126 can execute a cleaning process before executing an imprint process in response to the command. Alternatively, the main control unit 126 may perform a cleaning process during an idling time in which no article is manufactured, or may perform a cleaning process every time a set number of substrates are processed or every time one substrate is processed. Alternatively, the main control unit 126 may perform a cleaning process every time a pattern is formed in a shot region.

A cleaning process may be executed based on the evaluation performed to check the necessity to execute the cleaning process. For example, a pattern (first sample) is formed in one or a plurality of shot regions by imprinting using a mold for evaluation. After the mold is charged, the peripheral member 113 is moved while the mold faces the peripheral member 113. A pattern (second sample) is then formed in one or a plurality of shot regions by imprinting using the mold. The state of the peripheral member 113 can be evaluated by comparing the number of defects in the first sample with the number of defects in the second sample.

Figure 7:
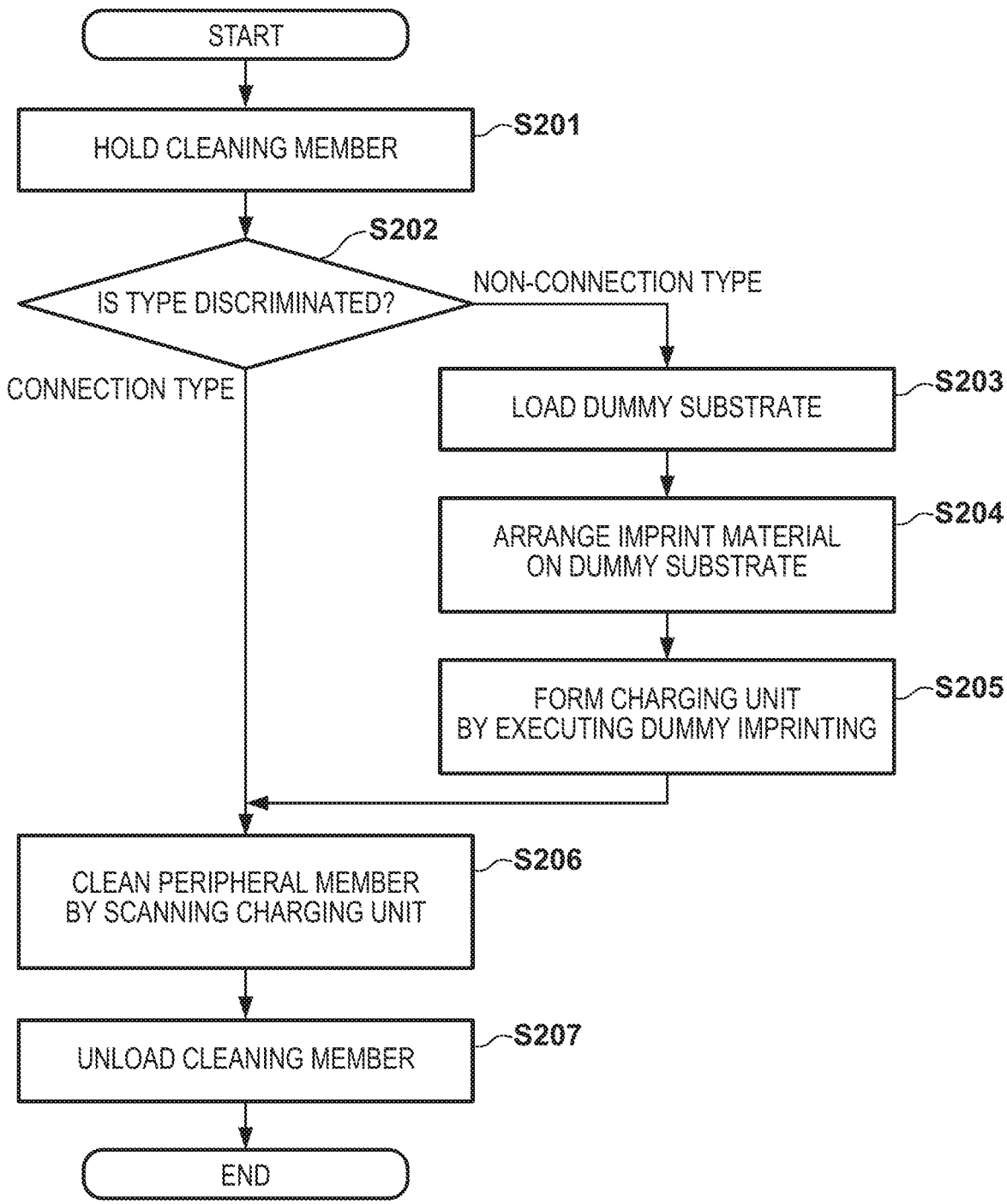
FIG. 7 is a flowchart exemplifying the cleaning sequence of the peripheral portion.

FIG. 7 exemplifies a cleaning sequence for the peripheral member 113. The main control unit 126 controls this cleaning sequence. In step S201, the main control unit 126 instructs the transfer mechanism (not shown) to cause the holding unit 119 to hold the cleaning member 170. In step S202, the main control unit 126 discriminates the type of cleaning member 170. The type of the cleaning member 170 can be discriminated by, for example, the identifier provided for the cleaning member 170. Alternatively, the type of cleaning member 170 can be discriminated based on the result of measuring the charge amount of the charging unit of the cleaning member 170 by using a measurement device that measures a surface potential.

As exemplified by FIG. 3A, a cleaning member of a type that generates charge through an operation of bringing the dielectric member into contact with an imprint material and releasing the dielectric member from it will be referred to as a non-connection type. In addition, as exemplified by FIGS. 3B and 3C, a cleaning member of a type that uses an electret will be referred to as a connection type. If the main control unit 126 determines in step S202 that the cleaning member 170 is of the non-connection type, the process advances to step S203. If the main control unit 126 determines that the cleaning member 170 is of the connection type, the process advances to step S206.

In step S203, the main control unit 126 instructs the transfer mechanism (not shown) to transfer a dummy substrate onto the substrate chuck 102. In step S204, the main control unit 126 controls the substrate driving mechanism SDM and the dispenser 111 to arrange an imprint material on the dummy substrate. In step S205, the main control unit 126 controls a dummy imprint operation of bringing the dielectric member of the cleaning member 170 into contact with the imprint material on the dummy substrate, causing the curing unit 104 to cure the imprint material, and releasing the dielectric member from the cured imprint material. With this dummy imprint operation, the dielectric member is charged, and the charging unit is prepared. Using the connection type cleaning member 170 makes it unnecessary to perform a process for charging like that performed in steps S203 to S205.

In step S206, the main control unit 126 executes a cleaning process for the peripheral member 113. More specifically, the main control unit 126 moves (scans) the cleaning member 170 relative to at least a partial region of the peripheral member 113 while the charging unit of the cleaning member 170 faces the partial region. With this operation, the particles 150 in the region are released from the region and attached to the charging unit, thereby cleaning the region.

In step S207, the main control unit 126 instructs the transfer mechanism (not shown) to unload the cleaning member 170. In this case, when the holding unit 119 dedicated to hold the cleaning member 170 is provided, steps S201 and S207 are not necessary, and the cleaning member 170 can be kept held by the holding unit 119.

As exemplified by FIG. 8, the above cleaning process may be adopted to remove particles from the substrate chuck 102 (substrate holding region 1021). The substrate holding region 1021 of the substrate chuck 102 can have a pin and/or a ring for supporting the substrate 101. If particles are attached to the pin and/or ring, the substrate 101 may be deformed to cause defects in a formed pattern.

Accordingly, the main control unit 126 can be configured to control a cleaning process for the substrate chuck 102 (substrate holding region 1021). In this cleaning process, the particles 150 on the substrate chuck 102 are attracted to the charging unit by moving the cleaning member 170 relative to the substrate chuck 102 while the charging unit of the cleaning member 170 faces the substrate chuck 102.

Figure 9:
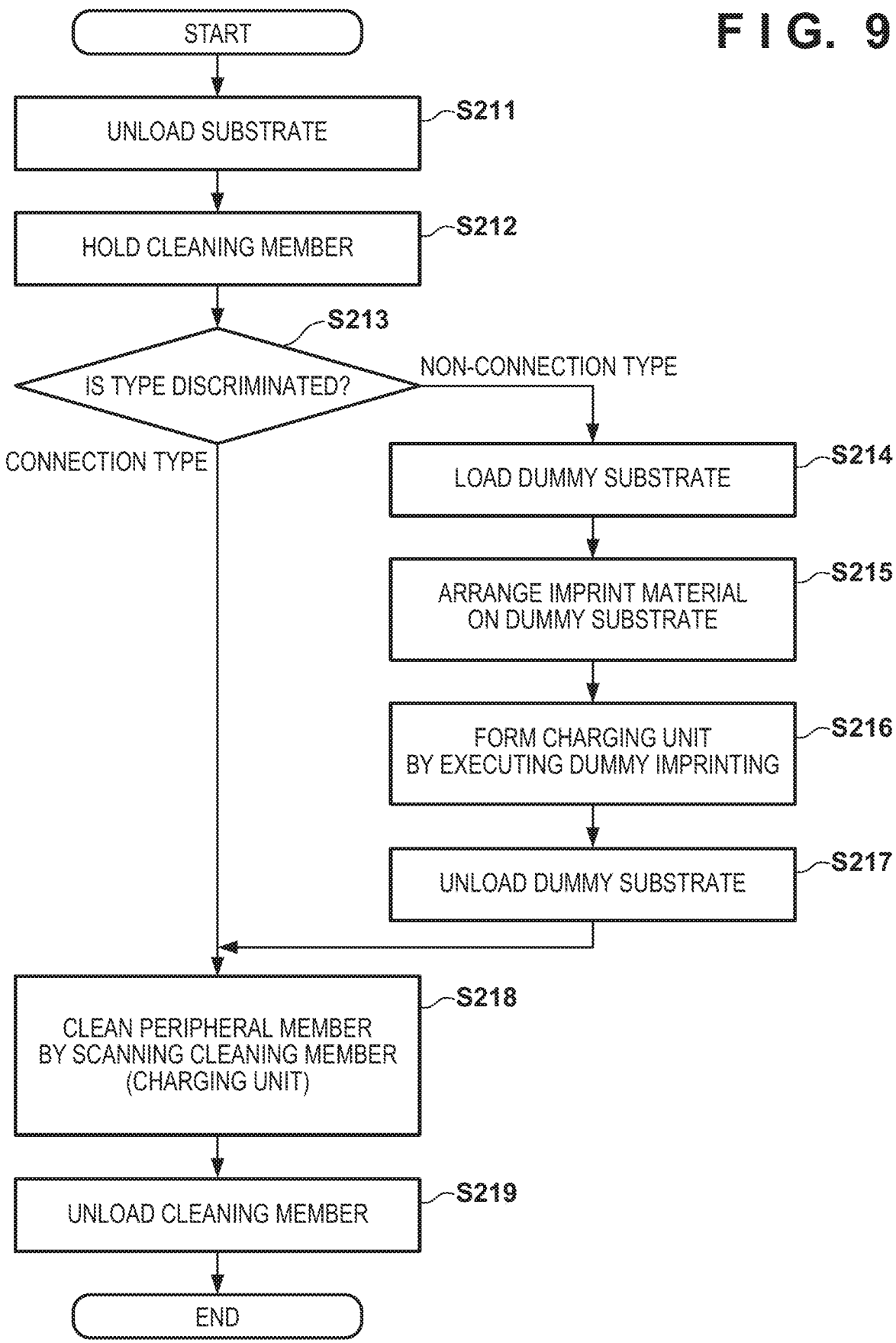
FIG. 9 is a flowchart exemplifying the cleaning sequence of the substrate chuck.

FIG. 9 exemplifies a cleaning sequence for the substrate chuck 102. The main control unit 126 controls this cleaning sequence. In step S211, if there is the substrate 101 on the substrate chuck 102, the main control unit 126 instructs the transfer mechanism (not shown) to unload the substrate 101. In step S212, the main control unit 126 instructs the transfer mechanism (not shown) to cause the holding unit 119 to hold the cleaning member 170. In step S213, the main control unit 126 discriminates the type of cleaning member 170. If the main control unit 126 determines in step S213 that the cleaning member 170 is of the non-connection type, the process advances to step S214. If the main control unit 126 determines that the cleaning member 170 is of the connection type, the process advances to step S218.

In step S214, the main control unit 126 instructs the transfer mechanism (not shown) to transfer a dummy substrate onto the substrate chuck 102. In step S215, the main control unit 126 controls the substrate driving mechanism SDM and the dispenser 111 to arrange an imprint material on the dummy substrate. In step S216, the main control unit 126 controls a dummy imprint operation of bringing the dielectric member of the cleaning member 170 into contact with the imprint material on the dummy substrate, causing the curing unit 104 to cure the imprint material, and releasing the dielectric member from the cured imprint material. With this dummy imprint operation, the dielectric member is charged, and the charging unit is prepared. In step S217, the main control unit 126 instructs the transfer mechanism (not shown) to unload the dummy substrate from the substrate chuck 102. For the connection type cleaning unit 170, a process for charging like that in steps S214 to S217 is not necessary.

In step S218, the main control unit 126 executes a cleaning process for the substrate chuck 102. More specifically, the main control unit 126 moves (scans) the cleaning member 170 relative to the substrate chuck 102 while the charging unit of the cleaning member 170 faces at least a partial region of the substrate chuck 102. With this operation, the particles 150 in the partial region of the substrate chuck 102 are released from the substrate chuck 102 and attracted to the charging unit, thereby cleaning the partial region of the substrate chuck 102.

In step S219, the main control unit 126 instructs the transfer mechanism (not shown) to unload the cleaning member 170. In this case, when the holding unit 119 dedicated to hold the cleaning member 170 is provided, steps S212 and S219 are not necessary, and the cleaning member 170 can be kept held by the holding unit 119.

The main control unit 126 may be implemented by a PLD (Programmable Logic Device) such as an FPGA (Field Programmable Gate Array). Alternatively, for example, the main control unit 126 may be implemented by a general-purpose computer incorporating an ASIC (Application Specific Integrated Circuit) or programs. Furthermore, the main control unit 126 may be implemented by a combination of all or some of the above constituent elements. The remaining control units 120 to 125 each can be implemented by a PLD such as an FPGA, ASIC, a general-purpose computer incorporating programs, or a combination of all or some of the above constituent elements.

A method of manufacturing articles will be described below. The following will exemplify the method of manufacturing devices (semiconductor integrated circuit elements, liquid crystal display elements, and the like) as articles. The method of manufacturing articles includes a step of forming a pattern on a substrate (a wafer, glass plate, or film-form substrate) by using the above imprint apparatus. Furthermore, the manufacturing method can include a step of processing (for example, etching) the substrate on which the pattern is formed. When manufacturing other articles such as patterned media (recording media) or optical elements, the manufacturing method may include other processes which machine the substrate on which the pattern is formed instead of etching. The method of manufacturing articles according to this embodiment is advantageous in terms of at least one of performance, quality, productivity, and production cost of articles in comparison with the method according to the related art.

Second Embodiment

The above cleaning process can be performed (a) before the execution of a imprint process, (b) when the imprint apparatus is in an idling state, or (c) after a set number of substrates are processed. The following will exemplify a case in which a charging unit is arranged at a specific position in an imprint apparatus IMP to execute a cleaning process concurrently with a series of imprint operations without providing any specific time for a cleaning process.

Figure 10:
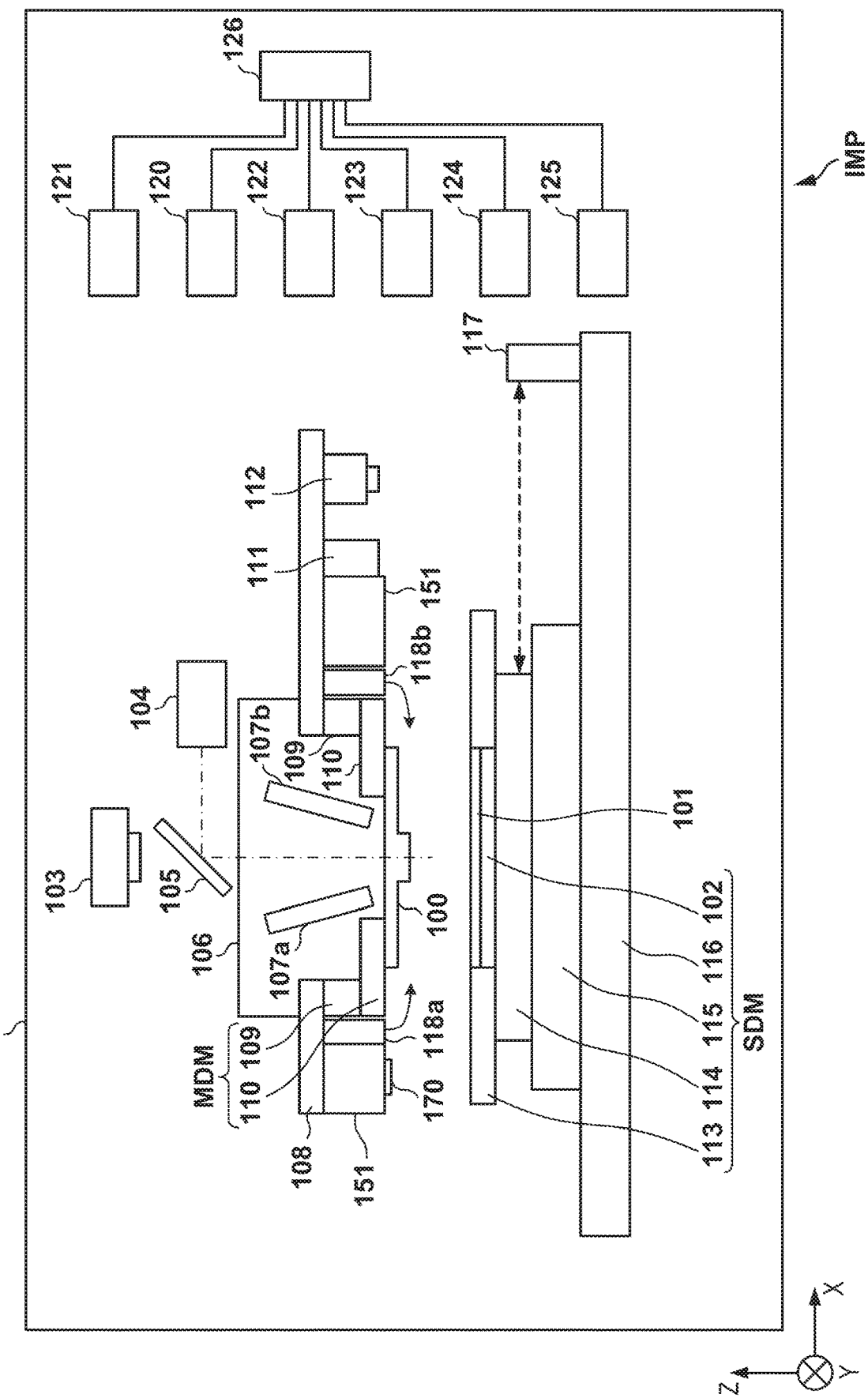
FIG. 10 is a view schematically showing the arrangement of an imprint apparatus according to the second embodiment of the present invention.
Figure 11:
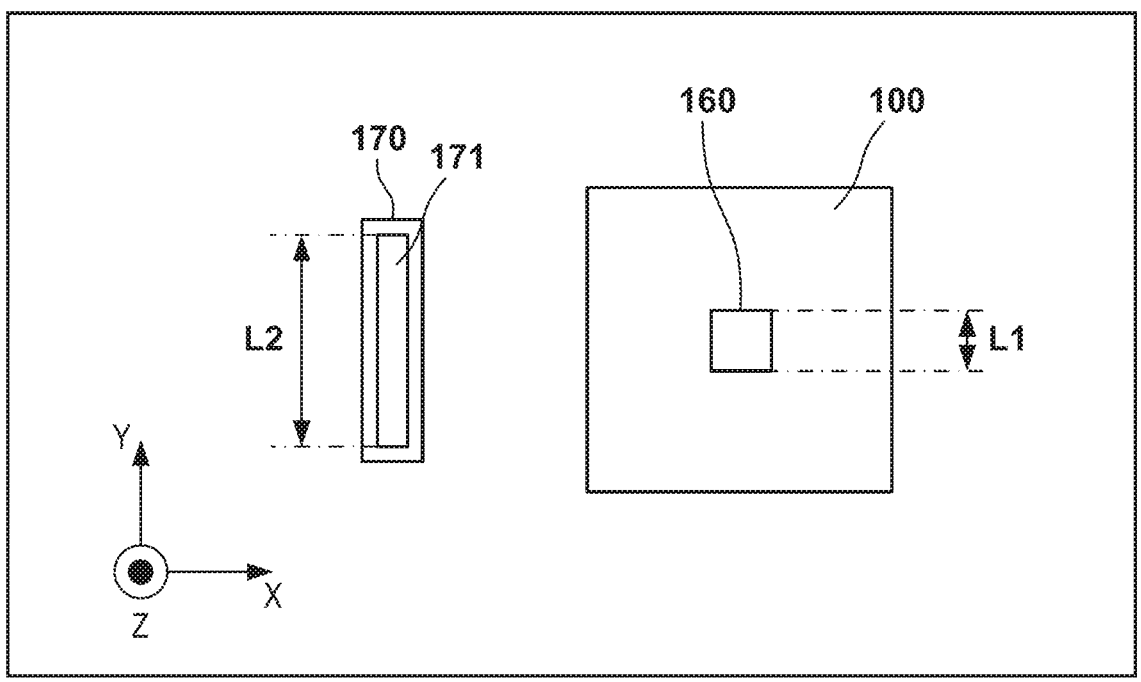
FIG. 11 is a view showing the arrangement example of a cleaning member.

FIG. 10 exemplifies the arrangement of an imprint apparatus IMP according to the second embodiment of the present invention. A cleaning member 170 is arranged such that a mold 100 is positioned between the cleaning member 170 and a dispenser 111. A peripheral member 151 arranged on the periphery of a mold chuck 110 can hold the cleaning member 170. As exemplified by FIG. 11, the cleaning member 170 has a charging unit 171.

In the second embodiment, the cleaning member 170 is arranged such that the mold 100 is positioned between the cleaning member 170 and the dispenser 111. With this arrangement, in a sequence in which a shot region as an imprint target is moved below the dispenser 111, and the mold 100 is then vertically moved, a part of a region 140 shown in FIG. 5 faces the cleaning member 170 to be cleaned. Such a sequence is sequentially executed for a plurality of shot regions to allow the cleaning member 170 to clean the entire region 140. This shortens the time required to clean a peripheral member 113. This will contribute to an increase in throughput concerning pattern formation by imprinting.

A width L2 of the charging unit 171 in a direction perpendicular to the direction in which the cleaning member 170, the mold 100, and the dispenser 111 are arrayed is preferably larger than a width L1 of a pattern portion 160 of the mold 100 in consideration of efficiency in cleaning.

Figure 12:
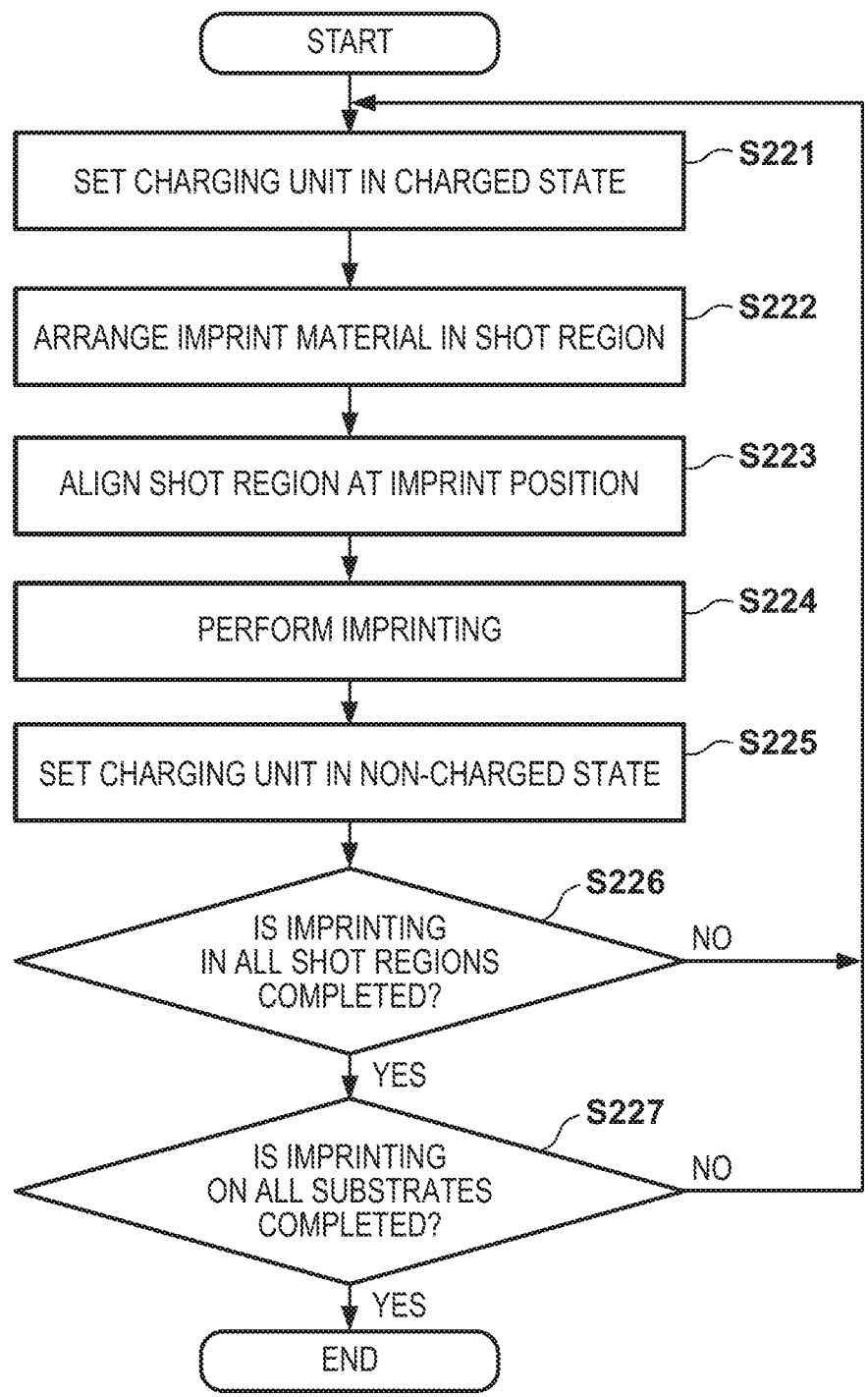
FIG. 12 is a flowchart exemplifying the operation of the imprint apparatus according to the second embodiment of the present invention.

FIG. 12 exemplifies the operation of the imprint apparatus IMP according to the second embodiment. Assume that in this case, the charging unit 171 of the cleaning member 170 is set in a charged state by an operation for charging, and is set in a non-charged state by an operation for discharging. Note, however, that the charging unit 171 that does not require such operation may be used. In such a case, steps S201 and S205 to be described below are not necessary. In a simple case, the charging unit 171 can be set in a charged state by being supplied with charge, and can be set in a non-charged state by removing charge.

First of all, in step S221, a main control unit 126 sets the charging unit 171 in a charged state. In step S222, the main control unit 126 controls the dispenser 111 and a substrate driving mechanism SDM so as to arrange an imprint material in a shot region as an imprint target. In this case, the shot region as an imprint target is arranged below the dispenser 111. In step S223, the main control unit 126 controls the substrate driving mechanism SDM so as to arrange the shot region as an imprint target below the mold 100. In steps S222 and S223, a region of the surface of the peripheral member 113 which faces the charging unit 171 of the cleaning member 170 is cleaned.

In step S224, first of all, the main control unit 126 controls a mold driving mechanism MDM so as to bring the mold 100 into contact with the imprint material on the shot region as an imprint target. In step S024, the main control unit 126 controls a curing unit 104 so as to cure the imprint material. Thereafter, the main control unit 126 controls the mold driving mechanism MDM so as to release the mold 100 from the cured imprint material. In step S225, the main control unit 126 sets the charging unit 171 in a non-charged state.

In step S226, the main control unit 126 determines whether imprinting has been completed for all the shot regions on the substrate. If there is any shot region for which imprinting has not been performed, the process returns to step S221 to repeat a process for the remaining shot region. If imprinting for all the shot regions has been completed, the main control unit 126 determines in step S227 whether imprinting for all the substrates has been completed. If there is any shot region for which imprinting has not been performed, the main control unit 126 returns to step S201 to repeat a process for the remaining substrate.

Figure 13:
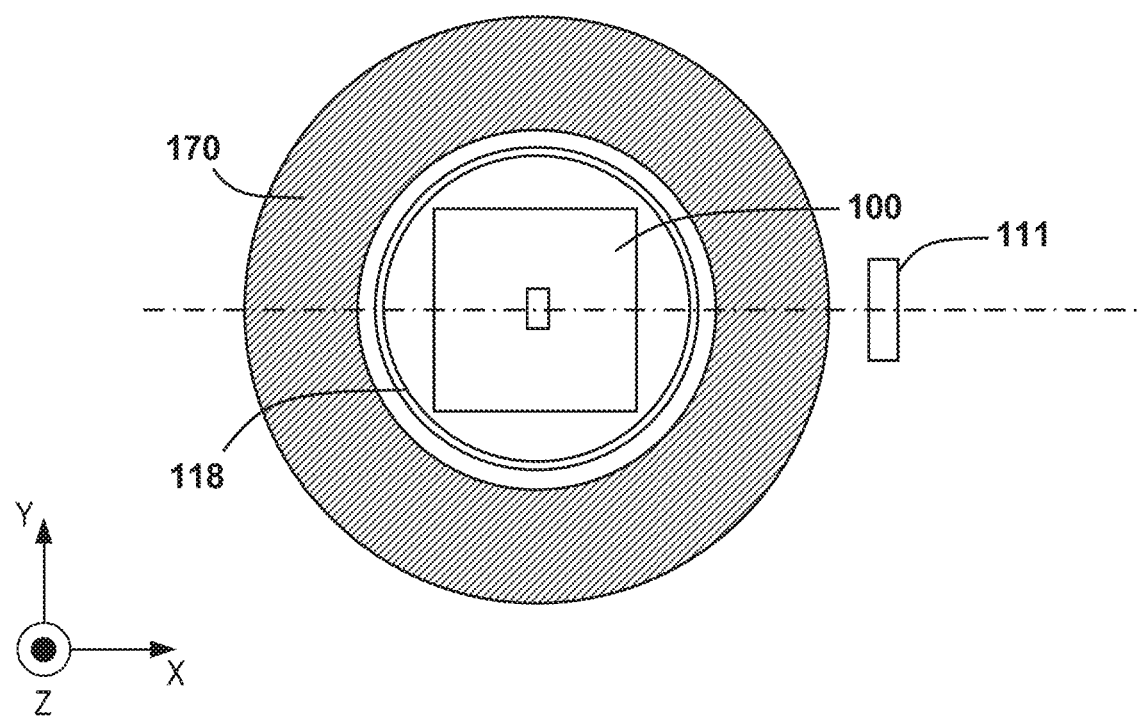
FIG. 13 is a view showing the arrangement of another cleaning member.

In order to clean a region larger than the peripheral member 113 by using the cleaning member 170, the cleaning member 170 having a larger area is useful, as exemplified in FIG. 13. The cleaning member 170 exemplified by FIG. 13 has a shape surrounding the mold 100 in all directions.

Various types of mechanisms can be arranged around the mold 100. In this case, it may be difficult to adopt the cleaning member 170 surrounding the mold 100 in all directions. Examples of mechanisms that can be arranged around the mold 100 include a mechanism for deforming the mold 100 by applying a force to the side surface of the mold 100, a mechanism for adjusting the inclination of the mold 100, and a mechanism as part of the mold driving mechanism MDM.

Figure 14:
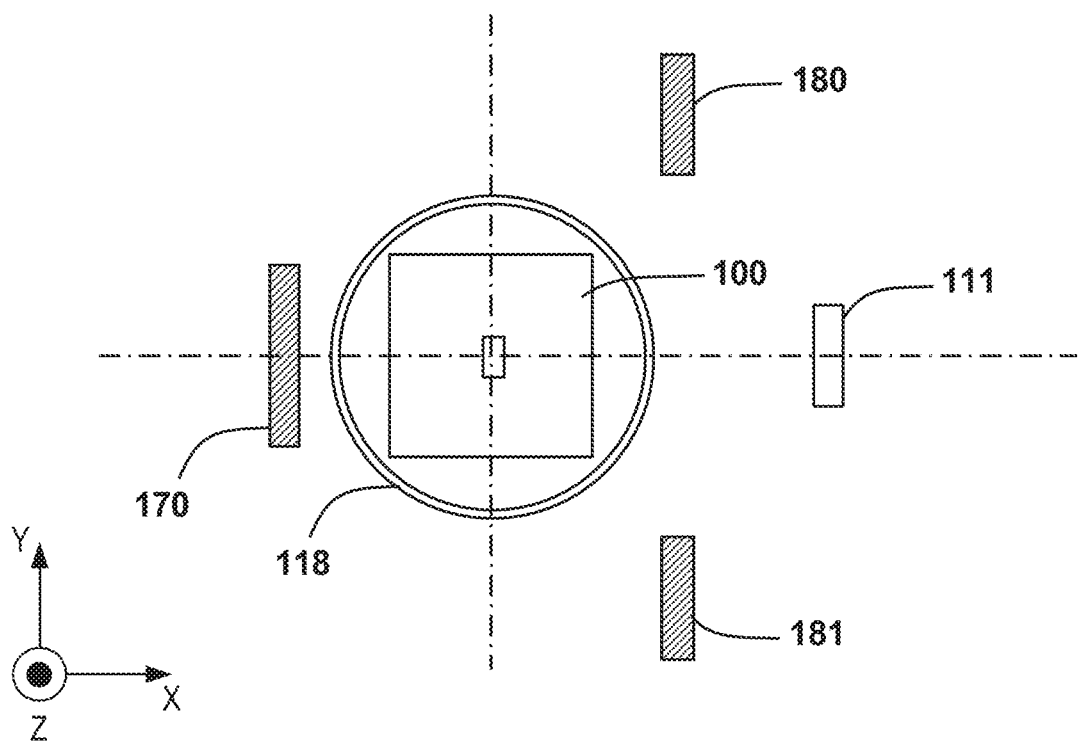
FIG. 14 is a view showing the arrangement of still another cleaning member.
Figure 15A:
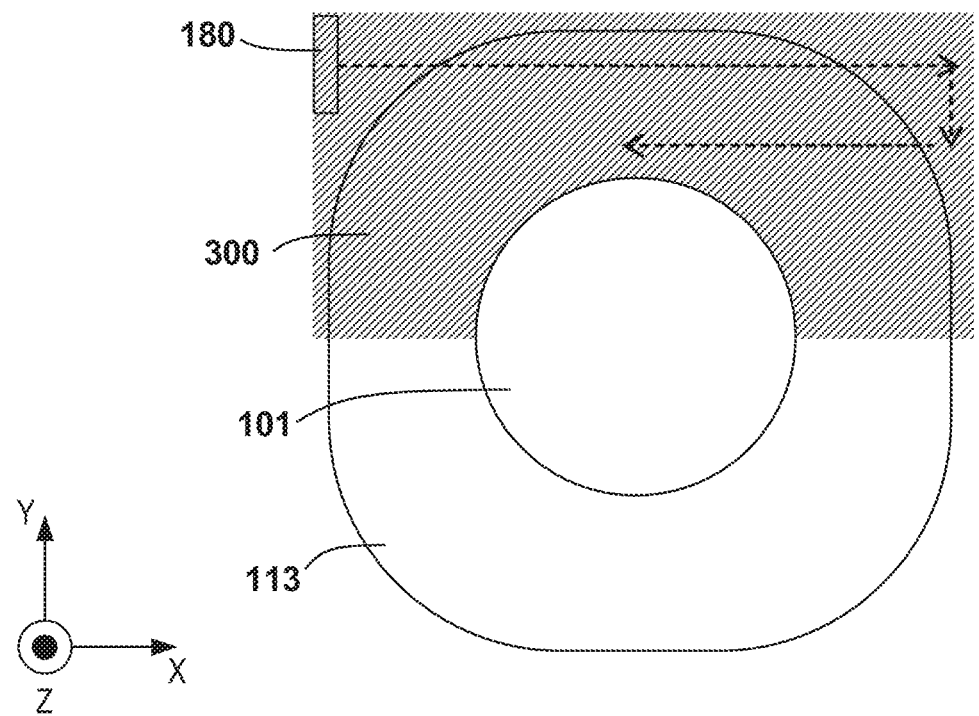
FIG. 15A is a view for explaining cleaning of a peripheral member by the cleaning member shown in FIG. 14.
Figure 15B:
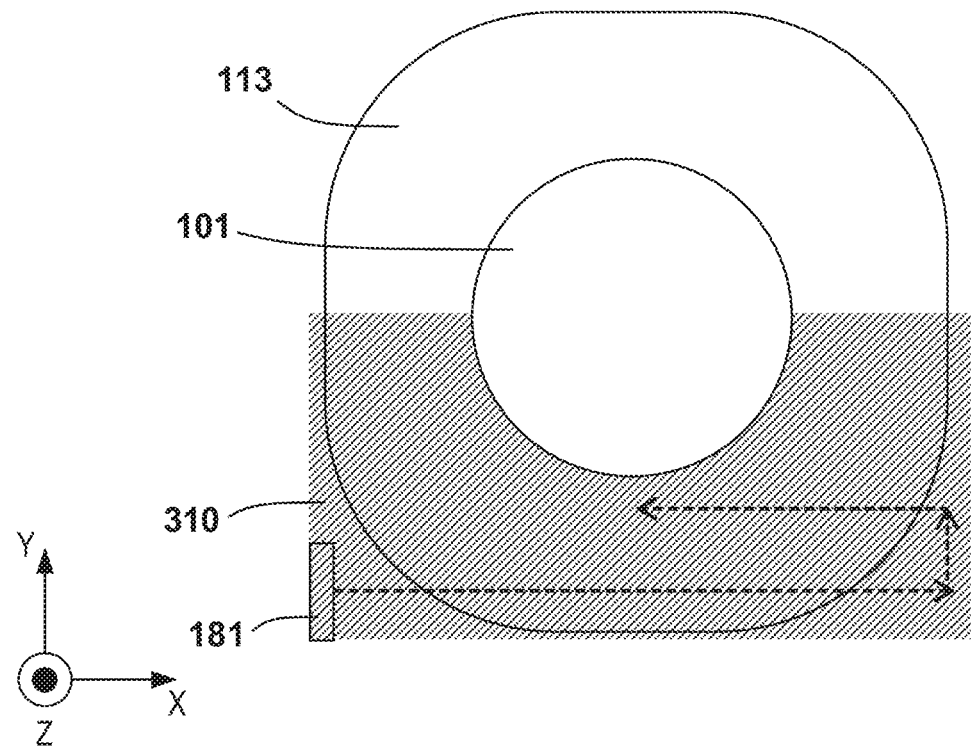
FIG. 15B is a view for explaining cleaning of the peripheral member by the cleaning member shown in FIG. 14.

FIG. 14 shows a case in which cleaning members 180 and 181 are provided in addition to the cleaning member 170. That is, FIG. 14 shows a case in which the plurality of cleaning members 170, 180, and 181 are provided. As exemplified by FIG. 15A, the cleaning member 180 cleans a partial region 300 of the peripheral member 113. As exemplified by FIG. 15B, the cleaning member 181 cleans another region 310 of the peripheral member 113. It is possible to restrict an increase in the size of the imprint apparatus IMP by providing a plurality of cleaning members and assigning them with regions to be cleaned. In this case, the cleaning member 170 can be used to clean the peripheral member 113 concurrently with imprinting for a plurality of shot regions on the substrate 101. On the other hand, the cleaning members 180 and 181 can be used in a dedicated cleaning sequence executed in a period during which no imprinting is performed for the substrate 101, for example, in a maintenance period or idling period.

Third Embodiment

An imprint apparatus IMP preferably includes an electricity discharging mechanism for discharging a charged mold 100 when the mold 100 is released from a cured imprint material. For example, an ionizer is used to discharge the mold 100. There are various types of ionizers such as a corona discharge scheme and an energy line irradiation scheme (for example, an X-ray irradiation scheme or α-ray irradiation scheme). A corona discharge scheme can be a factor that generates particles. In order to discharge the mold 100 while maintaining cleanness, therefore, it is preferable to use the X-ray irradiation scheme or α-ray irradiation scheme. Because the space between the mold 100 and a substrate 101 is very small, it is difficult to arrange an ionizer around the space and directly irradiate the mold 100 with X-rays or α-rays. Except for the scheme of directly irradiating the mold 100 with X-rays or α-rays, there is available a scheme of irradiating a gas with X-rays or α-rays to ionize the gas and supplying the ionized gas to the space under the mold 100. Note, however, that the ion concentration of an ionized gas decreases while the gas passes through a pipe line and a nozzle and further passes through a path from the nozzle to the space between the mold 100 and the substrate 101, and hence a sufficient ion concentration sometimes cannot be maintained in the space under the mold 100. In such a case, the mold 100 cannot be efficiently discharged.

Accordingly, in this embodiment, an electricity discharging gas is supplied from a purge gas supply unit 118. An electricity discharging gas may be supplied from a gas supply unit different from the purge gas supply unit 118. As shown in FIG. 16A, the space around the mold 100 is preferably filled with an electricity discharging gas before a pattern portion 160 of the mold 100 is released from a cured imprint material. The purge gas supply unit 118 may stop supplying an electricity discharging gas before the pattern portion 160 is released or may keep supplying the electricity discharging gas during a releasing operation as long as the space around the mold 100 is sufficiently filled with the electricity discharging gas. As a result, as shown in FIG. 16B, in a step of releasing the pattern portion 160 from the cured imprint material, the surrounding electricity discharging gas is drawn into the gap between the pattern portion 160 and the substrate 101 to be replaced.

An electricity discharging gas needs to contain a gas having a longer mean free path for electrons than air. Specifically, the electricity discharging gas may be a rare gas constituted by monatomic molecules. Among rare gases, helium is in particular preferable, which has the longest mean free path. Electrons present in an electric field are carried to the anode side by the electric field, and collide with gas molecules in the process of being carried. In this case, when the electrons, which have sufficiently been accelerated to have energy higher than the ionization energy of the gas, collide with gas molecules, ionization occurs, and electron-cation pairs are generated. The generated electrons are also accelerated by the electric field to ionize gas molecules. Ionization sequentially occurs in this manner to generate a large number of electron-cation pairs. This phenomenon is called an electron avalanche. In a gas having a long mean free path for electrons, electrons in the process of being accelerated do not collide with gas molecules and are accelerated to a high energy state. Accordingly, a gas having a long mean free path for electrons more easily causes an electron avalanche even in a low electric field than air. This makes it possible to discharge the mold 100 before a large amount of voltage is accumulated.

In general, an electricity discharging gas has high diffuseness, and can be used as a purge gas in an imprint space when the pattern portion 160 is filled with an imprint material. The following will discuss about voltages to be applied to the charging unit 171 when a charging unit 171 of a cleaning member 170 generates an electric field between itself and a peripheral member 113 to perform a cleaning process on the peripheral member 113. When an electricity discharging gas enters the gap between the charging unit 171, to which a voltage has been applied, and the peripheral member 113 to cause an electron avalanche, a large number of electrons or cations are supplied onto the surface of the charging unit 171 to cause a voltage drop in the charging unit 171, thereby reducing the cleaning effect. Accordingly, the voltage to be applied to the charging unit 171 needs to be set such that the strength of the electric field generated between the charging unit 171 and the peripheral member 113 becomes equal to or less than the electric field strength at which discharge occurs through an electricity discharging gas. For this reason, a voltage control unit 172 that controls the voltage to be applied to the charging unit 171 can be provided. The voltage control unit 172 sets the voltage to be applied to the charging unit 171 such that the strength of the electric field generated between the charging unit 171 and the peripheral member 113 becomes equal to or less than the electric field strength at which discharge occurs through an electricity discharging gas. Whether an electronic avalanche occurs between the charging unit 171 and the peripheral member 113 depends on the electric field strength and the type of electricity discharging gas. Accordingly, the value of voltage to be applied to the charging unit 171 may be decided depending on the distance between the charging unit 171 and the peripheral member 113 and the type of electricity discharging gas. That is, the value of voltage to be applied to the charging unit 171 varies depending on the type of electricity discharging gas and the distance between the charging unit 171 and the peripheral member 113.

After a process of releasing the mold 100 from a cured imprint material, an electricity discharging gas maintains the voltage of the mold 100 at a voltage or less at which discharge occurs through the electricity discharging gas. Accordingly, performing a cleaning process for the peripheral member 113 by using the cleaning member 170 whose charging unit 171 is set to the above voltage can prevent the particles 150 from being attached to the mold 100.

While no electricity discharging gas is supplied from the purge gas supply unit 118, the voltage applied to the charging unit 171 may be set to a value that makes the strength of the electric field generated between the charging unit 171 and peripheral member 113 become higher than the electric field strength at which discharge occurs through the electricity discharging gas. For example, while no imprint process is performed, a voltage higher than that in the imprint process may be set in the charging unit 171 to perform a cleaning process. Even in an imprint process, while no electricity discharging gas is supplied, the voltage applied to the charging unit 171 may be increased to enhance the cleaning effect.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

The invention claimed is:

1. An imprint apparatus for forming a pattern on a substrate by curing an imprint material while a mold is in contact with the imprint material on the substrate, the apparatus comprising:
   a substrate chuck having a substrate holding region for holding the substrate;
   a peripheral member arranged to surround a side surface of the substrate held by the substrate chuck;
   a control unit configured to control a cleaning process for cleaning at least a partial region of the peripheral member by using a cleaning member including a charging unit; and
   a dispenser configured to supply an imprint material onto the substrate, wherein
   the charging unit is arranged such that a mold driving mechanism configured to drive the mold is located between the dispenser and the charging unit,
   the charging unit faces the at least the partial region of the peripheral region in a sequence in which the imprint material is supplied onto a shot region of the substrate by the dispenser, and the shot region is moved below the mold,
   the cleaning process includes an operation of attracting a particle in the partial region to the charging unit while the charging unit faces the at least the partial region of the peripheral member.

2. The imprint apparatus according to claim 1, wherein the mold driving mechanism is located at a first azimuth position when viewed from the dispenser, and the partial region includes a region, of an upper surface of the peripheral member, which is located closer to the first azimuth position than a side surface of the substrate held by the substrate chuck which is located on a side of the first azimuth position.

3. The imprint apparatus according to claim 2, wherein the cleaning process is executed while no imprint material is present on the substrate, and the dispenser supplies no imprint material onto the substrate during the cleaning process.

4. The imprint apparatus according to claim 1, wherein the cleaning process further includes an operation for attracting a particle in the partial region to the charging unit by moving the cleaning member relative to the peripheral member while the charging unit faces the at least the partial region of the peripheral member,
   wherein in that the movement of the charging unit relative to the peripheral member includes a repetition of a unit of operation including relative movement in a direction parallel to a first direction and relative movement in a second direction intersecting with the first direction.

5. The imprint apparatus according to claim 4, wherein after a command is issued to the control unit to execute an imprint process for forming a pattern on the substrate by imprinting, the control unit executes the cleaning process before executing the imprint process in response to the command.

6. The imprint apparatus according to claim 1, wherein the charging unit includes an electrode and a dielectric material covering the electrode, the electrode faces the at least the partial region of the peripheral member via the dielectric material.

7. The imprint apparatus according to claim 1, wherein the cleaning process is executed while the cleaning member is held by the mold chuck configured to hold a mold.

8. The imprint apparatus according to claim 1, wherein a gap between the charging unit and the peripheral member in the cleaning process is smaller than a gap between the mold and the peripheral member when the substrate is moved to supply an imprint material onto the substrate.

9. The imprint apparatus according to claim 1, wherein the cleaning process is executed with the gap between the charging unit and the peripheral member being set to not more than 0.8 mm.

10. The imprint apparatus according to claim 1, wherein the charging unit includes a charged dielectric member.

11. The imprint apparatus according to claim 1, wherein the charging unit includes an electret.

12. The imprint apparatus according to claim 1, wherein the charging unit includes an electret holding positive charge and an electret holding negative charge.

13. The imprint apparatus according to claim 1, wherein the control unit controls an operation of causing the charging unit to attract a particle on the substrate chuck by moving the charging unit relative to the substrate chuck while no substrate is held by the substrate chuck.

14. An article manufacturing method comprising:
   a step of forming a pattern on a substrate by using an imprint apparatus defined in claim 1; and
   a step of processing the substrate on which the pattern is formed.

15. The imprint apparatus according to claim 1, wherein the control unit performs control for setting the charging unit of the cleaning member in a charged state or a non-charged state.

16. The imprint apparatus according to claim 1, wherein the control unit sets the charging unit in a charged state before the dispenser supplies an imprint material to the substrate.

17. The imprint apparatus according to claim 1, wherein a width of the charging unit in a direction perpendicular to a direction in which the cleaning member and the dispenser are arrayed is larger than a width of a pattern region.

18. The imprint apparatus according to claim 1, further comprising:

a gas supply unit configured to supply a gas for discharging the mold; and a voltage control unit configured to control a voltage applied to the charging unit.

19. The imprint apparatus according to claim 18, wherein the voltage control unit sets a voltage applied to the charging unit such that a strength of an electric field generated between the charging unit and the peripheral member becomes not more than an electric field strength at which discharge occurs through the gas.

20. The imprint apparatus according to claim 18, wherein the mold is discharged by replacing a gap between the mold released from a cured imprint material and the imprint material with the gas.

21. The imprint apparatus according to claim 18, wherein the gas includes a gas having a longer mean free path for electrons than air.

22. The imprint apparatus according to claim 18, wherein the gas includes helium.

23. The imprint apparatus according to claim 1, wherein the cleaning process further includes an operation for attracting a particle in the partial region to the charging unit by moving the cleaning member relative to the peripheral member while the charging unit faces the at least the partial region of the peripheral member,
wherein a path of the movement of the charging unit relative to the peripheral member includes a plurality of loops surrounding the substrate holding region, and the plurality of loops have different distances from the substrate holding region.

24. The imprint apparatus according to claim 1, wherein the cleaning member is used for cleaning the at least the partial region of the peripheral region in parallel with imprinting to a plurality of shot region of the substrate,
wherein a second cleaning member is used for cleaning the peripheral member during a period in which imprinting to the substrate is not performed.

25. The imprint apparatus according to claim 1, wherein the partial region of the peripheral region is a region which faces a pattern region of the mold in the sequence, the pattern region having a pattern to be transferred onto the imprint material on the substrate.

26. An imprint apparatus for forming a pattern on a substrate by curing an imprint material while a mold is in contact with the imprint material on the substrate, the imprint apparatus comprising:
a substrate chuck having a substrate holding region for holding the substrate;
a peripheral member arranged to surround a side surface of the substrate held by the substrate chuck; and
a control unit configured to control a cleaning process for cleaning at least a partial region of the peripheral member by using a cleaning member including a charging unit,
wherein the cleaning process includes an operation for attracting a particle in the partial region to the charging unit by moving the cleaning member relative to the peripheral member while the charging unit faces at least the partial region of the peripheral member, and
wherein the peripheral member includes a continuous portion having a smooth surface and a discontinuous portion having a rough surface, and the control unit sets a total time during which the charging unit is made to face the discontinuous portion per unit area to be longer than a total time during which the charging unit is made to face the continuous portion per unit area.

27. A method of operating an imprint apparatus including a substrate chuck configured to hold a substrate and a peripheral member arranged to surround a side surface of the substrate held by the substrate chuck, and a dispenser configured to supply an imprint material onto the substrate, the method comprising:
a step of performing a cleaning process for cleaning at least a partial region of the peripheral member by using a cleaning member including a charging unit; and
a step of performing a sequence of forming a pattern on the substrate by supplying an imprint material onto the substrate held by the substrate chuck and curing the imprint material while a mold is in contact with the imprint material,
wherein the charging unit is arranged such that a mold driving mechanism configured to drive the mold is located between the dispenser and the charging unit, and
wherein the cleaning process includes an operation for attracting, in the sequence, a particle in the partial region to the charging unit while the charging unit faces at least the partial region of the peripheral member.

28. An article manufacturing method comprising:
a step of forming a pattern on a substrate by operating an imprint apparatus according to an operation method defined in claim 27; and
a step of processing the substrate on which the pattern is formed.

29. The method according to claim 27, wherein the partial region of the peripheral region is a region which faces a pattern region of the mold in the sequence, the pattern region having a pattern to be transferred onto the imprint material on the substrate.

30. An imprint apparatus for forming a pattern on a substrate by curing an imprint material while a mold is in contact with the imprint material on the substrate, the imprint apparatus comprising:
a substrate chuck having a substrate holding region for holding the substrate;
a peripheral member arranged to surround a side surface of the substrate held by the substrate chuck;
a control unit configured to control a cleaning process for cleaning at least a partial region of the peripheral member by using a cleaning member including a charging unit,
a gas supply unit configured to supply a gas for discharging the mold; and
a voltage control unit configured to control a voltage applied to the charging unit,
wherein the cleaning process includes an operation for attracting a particle in the partial region to the charging unit by moving the cleaning member relative to the peripheral member while the charging unit faces at least the partial region of the peripheral member,
wherein the voltage control unit sets a voltage applied to the charging unit such that a strength of an electric field generated between the charging unit and the peripheral member becomes not more than an electric field strength at which discharge occurs through the gas, and
wherein a voltage applied to the charging unit varies depending on a type of the gas and a distance between the charging unit and the peripheral member.

31. An imprint apparatus for forming a pattern on a substrate by curing an imprint material while a mold is in contact with the imprint material on the substrate, the imprint apparatus comprising:

a substrate chuck having a substrate holding region for holding the substrate;

a peripheral member arranged to surround a side surface of the substrate held by the substrate chuck;

a control unit configured to control a cleaning process for cleaning at least a partial region of the peripheral member by using a cleaning member including a charging unit, a gas supply unit configured to supply a gas for discharging the mold; and a voltage control unit configured to control a voltage applied to the charging unit, wherein the cleaning process includes an operation for attracting a particle in the partial region to the charging unit by moving the cleaning member relative to the peripheral member while the charging unit faces at least the partial region of the peripheral member, wherein the voltage control unit sets a voltage applied to the charging unit, while the gas supply unit does not supply the gas, such that a strength of an electric field generated by the charging unit between the charging unit and the peripheral member becomes higher than an electric field strength at which discharge occurs through the gas.

32. An imprint apparatus for forming a pattern on a substrate by curing an imprint material while a mold is in contact with the imprint material on the substrate, the apparatus comprising:

a substrate chuck having a substrate holding region for holding the substrate;

a peripheral member arranged to surround a side surface of the substrate held by the substrate chuck;

a control unit configured to control a cleaning process for cleaning at least a partial region of the peripheral member by using a cleaning member including a charging unit;

a gas supply unit configured to supply a gas for discharging the mold; and a voltage control unit configured to control a voltage applied to the charging unit, wherein the cleaning process includes an operation for attracting a particle in the partial region to the charging unit by moving the cleaning member relative to the peripheral member while the charging unit faces at least the partial region of the peripheral member, and wherein the voltage control unit sets a voltage applied to the charging unit during a period in which the gas supply unit does not supply the gas to be higher than a voltage applied to the charging unit during a period in which the gas supply unit supplies the gas.

33. An imprint apparatus for forming a pattern on a substrate by curing an imprint material while a mold is in contact with the imprint material on the substrate, the imprint apparatus comprising:

a substrate chuck having a substrate holding region for holding the substrate;

a peripheral member arranged to surround a side surface of the substrate held by the substrate chuck; and a control unit configured to control a cleaning process for cleaning at least a partial region of the peripheral member by using a cleaning member including a charging unit, wherein the cleaning process includes an operation for attracting a particle in the partial region to the charging unit by moving the cleaning member relative to the peripheral member while the charging unit faces at least the partial region of the peripheral member, wherein the cleaning process is executed while the cleaning member is held by the mold chuck configured to hold a mold, and wherein the charging unit is charged by contacting the cleaning member with an imprint material on a dummy substrate, curing the imprint material on the dummy substrate, and separating the cleaning member from the cured imprint material on the dummy substrate.

* * * * *